(12) United States Patent
Huang et al.

(10) Patent No.: US 12,733,175 B2
(45) Date of Patent: Sep. 8, 2026

(54) MULTI-CHANNEL FERROELECTRIC MEMORY STRUCTURE

(71) Applicant: Taiwan Semiconductor Manufacturing Company, Ltd., Hsinchu (TW)

(72) Inventors: Yen-Chieh Huang, Changhua County (TW); Po-Ting Lin, Taichung City (TW); Song-Fu Liao, Taipei City (TW); Hai-Ching Chen, Hsinchu City (TW); Sai-Hooi Yeong, Zhubei City (TW); Yu-Ming Lin, Hsinchu City (TW); Chung-Te Lin, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1122 days.

(21) Appl. No.: 17/673,059

(22) Filed: Feb. 16, 2022

(65) Prior Publication Data

US 2023/0262989 A1 Aug. 17, 2023

(51) Int. Cl.
*H10D 30/01* (2025.01)
*H10B 51/20* (2023.01)
(Continued)

(52) U.S. Cl.
CPC ........... *H10B 51/30* (2023.02); *H10D 30/031* (2025.01); *H10D 30/0415* (2025.01);
(Continued)

(58) Field of Classification Search
CPC ........ H10B 51/30; H10B 51/10; H10B 51/20; H10B 53/30; H10D 30/031;
(Continued)

(56) References Cited

U.S. PATENT DOCUMENTS

2010/0006942 A1* 1/2010 Park ..................... H10B 10/125 257/350
2014/0106523 A1* 4/2014 Koldiaev ........... H10D 30/6757 438/212
(Continued)

FOREIGN PATENT DOCUMENTS

CN 112750825 A 5/2021

OTHER PUBLICATIONS

Kwon et al. "Recent progress in high performance and reliable n-type transition metal oxide-based thin film transistors" Semicond. Sci. Technol. 30 (2015) 024002 (16pp), published on Jan. 19, 2015.
(Continued)

*Primary Examiner* — Christine S. Kim
*Assistant Examiner* — Sesha Sairaman Srinivasan
(74) *Attorney, Agent, or Firm* — Eschweiler & Potashnik, LLC

(57) ABSTRACT

Various embodiments of the present disclosure are directed towards an integrated chip (IC) comprising a first electrode structure disposed in a substrate. A first ferroelectric structure is disposed on a first side of the first electrode structure. A channel structure is disposed on a first side of the first ferroelectric structure. The channel structure includes a plurality of individual channel structures and a plurality of insulator structures. The plurality of individual channel structures and the plurality of insulator structures are alternately stacked. A pair of source/drain (S/D) structures are disposed on the first side of the first ferroelectric structure. The pair of S/D structures extend vertically through the channel structure, and the first electrode structure is disposed laterally between the S/D structures of the pair of S/D structures.

20 Claims, 18 Drawing Sheets

3000

3002 Form a first electrode structure in a substrate
3004 Form a ferroelectric structure over the first electrode structure and the substrate
3006 Form a floating electrode structure over the ferroelectric structure
3008 Form a blocking structure over the floating electrode structure
3010 Form a channel structure over the blocking structure, where the channel structure comprises a plurality of individual channel structures and a plurality of insulator structures that are alternately stacked
3012 Form a pair of conductive structures in the channel structure
3014 Form a blocking layer over the channel structure and the pair of conductive structures
3016 Form a floating electrode layer over the blocking layer
3018 Form a ferroelectric layer over the floating electrode layer
3020 Form a metal layer over the ferroelectric layer
3022 Form a pair of openings over the pair of conductive structures
3024 Form a plurality of spacer structures along sidewalls of the pair of openings
3026 Form a first dielectric layer over the plurality of spacer structures and in the pair of openings
3028 Form a plurality of openings in the first dielectric layer
3030 Form a pair of S/D structures and a second electrode structure in the plurality of openings
3032 Form a second dielectric layer over the first dielectric layer, the second electrode structure, and the pair of S/D structures

(51) Int. Cl.
*H10B 51/30* (2023.01)
*H10B 53/30* (2023.01)
*H10D 30/67* (2025.01)
*H10D 30/69* (2025.01)
*H10D 62/10* (2025.01)

(52) U.S. Cl.
CPC ..... *H10D 30/6713* (2025.01); *H10D 30/6735* (2025.01); *H10D 30/6757* (2025.01); *H10D 30/701* (2025.01); *H10D 62/118* (2025.01)

(58) Field of Classification Search
CPC ........... H10D 30/0415; H10D 30/6713; H10D 30/6735; H10D 30/6757; H10D 30/701; H10D 62/118
See application file for complete search history.

(56) References Cited

U.S. PATENT DOCUMENTS

2016/0141366 A1 5/2016 Lai et al.
2018/0366547 A1 12/2018 Liu
2019/0304987 A1* 10/2019 Dong ..................... H10D 30/69
2020/0006547 A1* 1/2020 Hsu ...................... H10D 30/797
2020/0176457 A1* 6/2020 Sharma ................ H10D 64/033
2020/0176610 A1 6/2020 Lee et al.
2020/0343265 A1 10/2020 Chang et al.
2020/0343372 A1* 10/2020 Yu ........................ H10D 30/024
2021/0399135 A1* 12/2021 Polakowski ......... H10D 64/033

OTHER PUBLICATIONS

Hays et al. "Effect of deposition conditions and composition on band offsets in atomic layer deposited Hf xSi1—x0y on InGaZn04" J. Vac. Sci. Technol. B 35(1), Jan./Feb. 2017, published on Jan. 11, 2017.

Hays et al. "Valence and conduction band offsets in sputtered Hf02/InGaZn04 heterostructures" Vacuum 116 (2015) 60-6<1, published on Mar. 13, 2015.

Robertson, J. "Band structures and band offsets of high K dielectrics on Si" Applied Surface Science I 90 (2002) 2-10, published in 2002.

Hays et al. "Energy band offsets of dielectrics on InGaZnO4" Applied Physics Reviews 4, 02 1301 (2017), published on Apr. 18, 2017.

Onaya et al. "Improvement in ferroelectricity of HfxZr 1 _xO 2 thin films using top- and bottom-ZrO2 nucleation layers" APL Mater. 7. 061107 (2019); doi: 10.1 063/ 1.5096626, published on Jun. 27, 2019.

Onaya et al. "Improvement in ferroelectricity of HfxZr1_xO2 thin films using ZrO2 seed layer" Applied Physics Express 10 , 081501 (2017), published on Jul. 13, 2017.

"Semiconductor Devices With Ferroelectric Layer and Methods of Manufacturing Thereof" The date of this U.S. Patent Application is unknown. Retrieved online on Nov. 19, 2021.

* cited by examiner

MULTI-CHANNEL FERROELECTRIC MEMORY STRUCTURE

BACKGROUND

Many modern electronic devices contain electronic memory configured to store data. Electronic memory may be volatile memory or non-volatile memory. Volatile memory stores data while it is powered, while non-volatile memory is able to keep data when power is removed. Some promising candidates for next generation memory technology utilize ferroelectricity to store data, such as ferroelectric field-effect transistor (FeFET) memory, ferroelectric random-access memory (FeRAM), and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
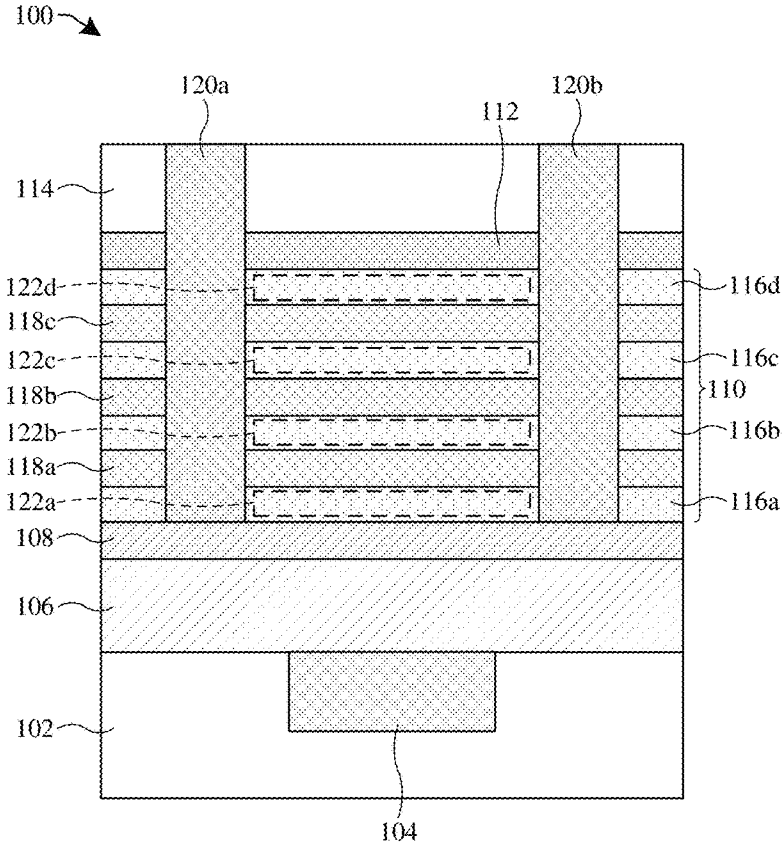
FIG. 1 illustrates a cross-sectional view of some embodiments of an integrated chip (IC) comprising a multi-channel ferroelectric memory structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips (ICs) comprise memory devices. For example, some ICs comprise ferroelectric memory devices (e.g., ferroelectric field-effect transistor (FeFET) memory, ferroelectric random-access memory (FeRAM), etc.) that include a plurality of ferroelectric memory cells (e.g., FeFET memory cell, FeRAM memory cell). Some ferroelectric memory cells comprise an electrode (e.g., a metal gate), a ferroelectric structure, a channel structure, and a pair of source/drain regions (e.g., metal-ferroelectric-semiconductor field-effect transistor (MFS-FET), metal-ferroelectric-insulator-semiconductor field-effect transistor (MFIS-FET), metal-ferroelectric-metal-insulator-semiconductor field-effect transistor (MFMIS-FET), etc.). A selectively-conductive channel is disposed in the channel structure and extends laterally between the source/drain regions. Typically, the channel structure comprises only a single selectively-conductive channel disposed in the channel structure.

The ferroelectric memory cell is configured to store data (e.g., binary "0" or binary "1") based on a polarization state of the ferroelectric structure. For example, the ferroelectric memory cell may have a high conductive state (e.g., a high conductive ON-state) associated with a first data state (e.g., binary "1") or a low conductive state (e.g., a low conductive OFF-state) associated with a second data state (e.g., binary "0"). In the high conductive state, the ferroelectric structure has a first polarization state (e.g., ferroelectric polarization pointing upward (P-up state)), thereby causing the selectively-conductive channel to have high conductivity. In the low conductive state, the ferroelectric structure has a second polarization state (e.g., ferroelectric polarization pointing downward (P-down state)), thereby causing the selectively-conductive channel to have low conductivity.

One challenge with the above ferroelectric memory cell is a relatively low ON/OFF current ratio (e.g., a ratio of the ON-current ($I_{ON}$)—the current between the source/drain regions when the ferroelectric memory cell is in the ON-state—to the OFF-current ($I_{OFF}$)—the current between the source/drain regions when the ferroelectric memory cell is in the OFF-state). The low $I_{ON}/I_{OFF}$ ratio may negatively affect the performance of the ferroelectric memory device (e.g., the low $I_{ON}/I_{OFF}$ ratio may cause slow read and/or write speeds, the low $I_{ON}/I_{OFF}$ ratio may cause increased power consumption, etc.). As such, the low $I_{ON}/I_{OFF}$ ratio may limit the applications in which ferroelectric memory may be employed (e.g., high speed data applications, ultra-low power applications, etc.).

Various embodiments of the present disclosure are related to a ferroelectric memory cell. The ferroelectric memory cell comprises a first electrode structure disposed in a substrate. A first ferroelectric structure is disposed on a first side of the first electrode structure. A channel structure is disposed on a first side of the first ferroelectric structure. The channel structure comprises a plurality of individual channel structures and a plurality of insulator structures that are alternately stacked. A pair of source/drain (S/D) structures are disposed on the first side of the first ferroelectric structure and extend vertically through the channel structure. A plurality of selectively-conductive channels are disposed in the plurality of individual channel structures, respectively.

Because the channel structure comprises the plurality of individual channel structures (and the plurality of selectively-conductive channels), the ferroelectric memory cell may have a high $I_{ON}/I_{OFF}$ ratio (e.g., higher than a typical ferroelectric memory cell). In some embodiments, the ferroelectric memory cell may have the high $I_{ON}/I_{OFF}$ ratio due to the plurality of individual channel structures (and the plurality of selectively-conductive channels) increasing the $I_{ON}$ and/or decreasing the $I_{OFF}$. Accordingly, the ferroelectric memory cell may increase the applications in which ferroelectric memory may be employed (e.g., high speed data applications, ultra-low power applications, etc.).

FIG. 1 illustrates a cross-sectional view 100 of some embodiments of an integrated chip (IC) comprising a multi-channel ferroelectric memory structure. In some embodiments, a ferroelectric memory cell of a ferroelectric memory device (e.g., ferroelectric field-effect transistor (FeFET) memory, ferroelectric random-access memory (FeRAM), etc.) comprises the multi-channel ferroelectric memory structure.

As shown in the cross-sectional view 100 of FIG. 1, the IC comprises a substrate 102. A first electrode structure 104 is disposed in the substrate 102. A first ferroelectric structure 106 is disposed over the first electrode structure 104 (e.g., disposed on a first side of the first electrode structure 104). A first blocking structure 108 is disposed over the first ferroelectric structure 106 (e.g., disposed on a first side of the first ferroelectric structure 106). A channel structure 110 is disposed over the first blocking structure 108 (e.g., disposed on a first side of the first blocking structure 108). A passivation structure 112 is disposed over the channel structure 110 (e.g., disposed on a first side of the channel structure 110). A first dielectric layer 114 is disposed over the passivation structure 112 (e.g., disposed on a first side of the passivation structure 112).

The channel structure 110 comprises a plurality of individual channel structures 116 and a plurality of insulator structures 118. The plurality of individual channel structures 116 and the plurality of insulator structures 118 are vertically alternately stacked. For example, the plurality of individual channel structures 116 comprises a first individual channel structure **116*a*, a second individual channel structure 116*b*, a third individual channel structure 116*c*, and a fourth individual channel structure 116*d*; and the plurality of insulator structures 118 comprises a first insulator structure 118*a*, a second insulator structure 118*b*, and a third insulator structure 118*c*. The first individual channel structure 116*a* is disposed over the first blocking structure 108, the first insulator structure 118*a* is disposed over the first individual channel structure 116*a*, the second individual channel structure 116*b* is disposed over the first insulator structure 118*a*, the second insulator structure 118*b* is disposed over the second individual channel structure 116*b*, the third individual channel structure 116*c* is disposed over the second insulator structure 118*b*, the third insulator structure 118*c* is disposed over the third individual channel structure 116*c*, and the fourth individual channel structure 116*d* is disposed over the third insulator structure 118*c***.

Each individual channel structure of the plurality of individual channel structures 116 is vertically separated from a neighboring individual channel structure by a corresponding one of the plurality of insulator structures 118. For example, the first individual channel structure **116*a* neighbors the second individual channel structure 116*b*, and the first insulator structure 118*a* vertically separates the first individual channel structure 116*a* from the second individual channel structure 116*b*. The second individual channel structure 116*b* also neighbors the third individual channel structure 116*c*, and the second insulator structure 118*b* vertically separates the second individual channel structure 116*b* from the third individual channel structure 116*c*. The third individual channel structure 116*c* also neighbors the fourth individual channel structure 116*d*, and the third insulator structure 118*c* vertically separates the third individual channel structure 116*c* from the fourth individual channel structure 116*d***.

The plurality of insulator structures 118 electrically isolate the plurality of individual channel structures 116 from one another. For example, the first insulator structure **118*a* electrically isolates the first individual channel structure 116*a* from the second individual channel structure 116*b*, the second insulator structure 118*b* electrically isolates the second individual channel structure 116*b* from the third individual channel structure 116*c*, and the third insulator structure 118*c* electrically isolates the third individual channel structure 116*c* from the fourth individual channel structure 116*d***.

A pair of source/drain (S/D) structures 120 are disposed over the first ferroelectric structure 106 (e.g., on the first side of the first ferroelectric structure 106). The pair of S/D structures 120 extend, at least partially, vertically through the channel structure 110. For example, a first S/D structure **120*a* and a second S/D structure 120*b* are disposed over the first ferroelectric structure 106. The first S/D structure 120*a* and the second S/D structure 120*b* extend vertically through the channel structure 110. The pair of S/D structures 120 may also be disposed over, at least partially, the first blocking structure 108. The first S/D structure 120*a* is laterally spaced from the second S/D structure 120*b*. The first electrode structure 104 is disposed laterally between the first S/D structure 120*a* and the second S/D structure 120*b***.

In some embodiments, the pair of S/D structures 120 contact (e.g., directly contact) the first blocking structure 108. In other embodiments, the pair of S/D structures 120 may be disposed over and vertically spaced from the first blocking structure 108. The pair of S/D structures 120 may contact (e.g., directly contact) two or more of the plurality of individual channel structures 116. The pair of S/D structures 120 are electrically coupled to two or more of the plurality of individual channel structures 116. In some embodiments, each of the plurality of individual channel structures 116 contact the pair of S/D structures 120, and each of the plurality of individual channel structures 116 are electrically coupled to the pair of S/D structures 120. The pair of S/D structures 120 may contact (e.g., directly contact) at least one of the plurality of insulator structures 118. In some embodiments, each of the plurality of insulator structures 118 contact the pair of S/D structures 120.

A plurality of selectively-conductive channels 122 are disposed in the plurality of individual channel structures 116, respectively. For example, a first selectively-conductive channel 122*a* is disposed in the first individual channel structure 116*a*, a second selectively-conductive channel 122*b* is disposed in the second individual channel structure 116*b*, a third selectively-conductive channel 122*c* is disposed in the third individual channel structure 116*c*, and a fourth selectively-conductive channel 122*d* is disposed in the fourth individual channel structure 116*d*. The plurality of selectively-conductive channels 122 extend laterally between the first S/D structure 120*a* and the second S/D structure 120*b*. For example, the first selectively-conductive channel 122*a*, the second selectively-conductive channel 122*b*, the third selectively-conductive channel 122*c*, and the fourth selectively-conductive channel 122*d* extend laterally between the first S/D structure 120*a* and the second S/D structure 120*b*.

The multi-channel ferroelectric memory structure is configured to store data (e.g., binary "0" or binary "1") based on a polarization state of the first ferroelectric structure 106. For example, the multi-channel ferroelectric memory structure may have a high conductive state (e.g., a high conductive ON-state) associated with a first data state (e.g., binary "1") or a low conductive state (e.g., a low conductive OFF-state) associated with a second data state (e.g., binary "0"). In the high conductive state, the first ferroelectric structure 106 has a first polarization state (e.g., P-up state), thereby causing the plurality of selectively-conductive channels 122 to have relatively high conductivity (e.g., relatively low resistivity). In the low conductive state, the first ferroelectric structure 106 has a second polarization state (e.g., P-down state), thereby causing the plurality of selectively-conductive channels 122 to have relatively low conductivity (e.g., relatively high resistivity).

The multi-channel ferroelectric memory structure can be programmed into either the high conductive state or the low conductive state by applying corresponding voltages to the first electrode structure 104 (e.g., applying voltages across the first ferroelectric structure 106 to set the polarization state of the first ferroelectric structure 106). For example, a first voltage (e.g., a positive voltage pulse) is applied to the first electrode structure 104 (e.g., via a metal interconnect wire that is electrically coupled to the first electrode structure 104) to place the first ferroelectric structure 106 into the first polarization state, thereby programming the multi-channel ferroelectric memory structure to the high conductive state. On the other hand, a second voltage (e.g., a negative voltage pulse) is applied to the first electrode structure 104 to place the first ferroelectric structure 106 into the second polarization state, thereby programming the multi-channel ferroelectric memory structure to the low conductive state. The multi-channel ferroelectric memory structure may be read by applying a read voltage to the first electrode structure 104 to sense the conductive state of the multi-channel ferroelectric memory structure (e.g., by sensing the conductivity of the plurality of selectively-conductive channels 122).

Because the channel structure 110 comprises the plurality of individual channel structures 116 (and the plurality of selectively-conductive channels 122), the multi-channel ferroelectric memory structure may have a high $I_{ON}/I_{OFF}$ ratio (e.g., higher than a typical ferroelectric memory cell). In some embodiments, the multi-channel ferroelectric memory structure may have the high $I_{ON}/I_{OFF}$ ratio due to the plurality of individual channel structures 116 (and the plurality of selectively-conductive channels 122) increasing the $I_{ON}$ and/or decreasing the $I_{OFF}$. Accordingly, the multi-channel ferroelectric memory structure may increase the applications in which ferroelectric memory may be employed (e.g., high speed data applications, ultra-low power applications, etc.).

Figure 2:
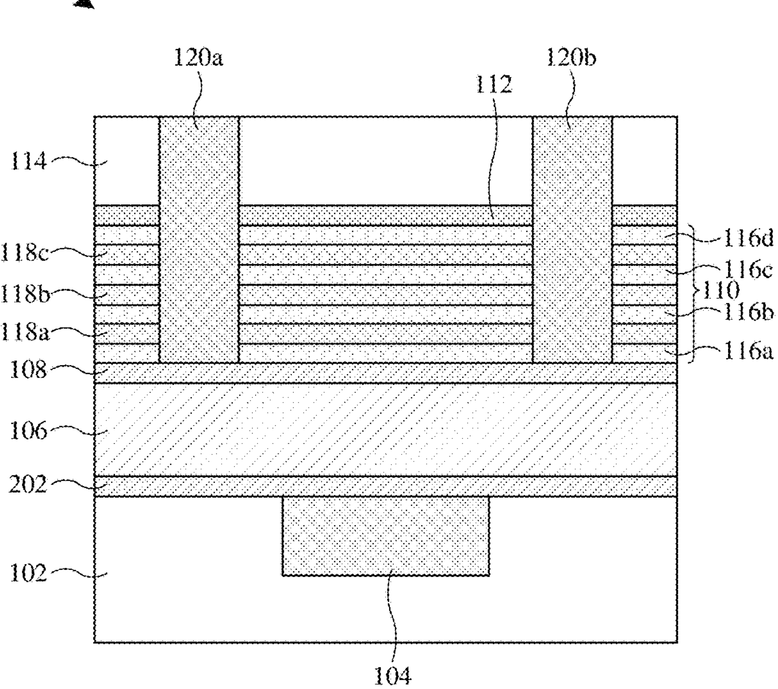
FIG. 2 illustrates a cross-sectional view of some other embodiments of the multi-channel ferroelectric memory structure of FIG. 1.

FIG. 2 illustrates a cross-sectional view 200 of some other embodiments of the multi-channel ferroelectric memory structure of FIG. 1.

As shown in the cross-sectional view 200 of FIG. 2, the first electrode structure 104 is buried in the substrate 102. In some embodiments, the first electrode structure 104 has an upper surface that is co-planar with an upper surface of the substrate 102. The substrate 102 may be or comprise, for example, a low-k dielectric (e.g., a dielectric material with a dielectric constant less than about 3.9), an oxide (e.g., silicon dioxide ($SiO_2$)), a nitride (e.g., silicon nitride (SiN)), an oxy-nitride (e.g., silicon oxy-nitride (SiON)), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), fluorine-doped silicon dioxide, organosilicate glass (OSG), carbon-doped oxide (CDO), porous silicon dioxide, porous OSG, porous CDO, a spin-on organic polymeric dielectric, a spin-on silicon based polymeric dielectric, any type of semiconductor body (e.g., silicon (Si), germanium (Ge), silicon-germanium (SiGe), monocrystalline silicon/CMOS bulk, a III-V semiconductor, etc.), some other suitable material, or a combination of the foregoing. In some embodiments, the substrate 102 is an intermetal dielectric (IMD) layer.

The first electrode structure 104 may be or comprise, for example, platinum (Pt), titanium (Ti), titanium nitride (TiN), tantalum (Ta), tantalum nitride (TaN), tungsten (W), tungsten nitride (WN), gold (Au), iron (Fe), nickel (Ni), beryllium (Be), chromium (Cr), cobalt (Co), antimony (Sb), iridium (Ir), molybdenum (Mo), osmium (Os), thorium (Th), vanadium (V), some other metal or metal nitride, or a combination of the foregoing. In some embodiments, the first electrode structure 104 is referred to as a first gate electrode.

In some embodiments, a buffer layer 202 is disposed over the first electrode structure 104 and the substrate 102 (e.g., disposed on the first side of the first electrode structure 104 and on a first side of the substrate 102). In other embodiments, the buffer layer 202 is omitted. The buffer layer 202 may overlie, at least partially, the first electrode structure 104. The buffer layer 202 may be or comprise, for example, tantalum oxide ($Ta_2O_5$), potassium oxide ($K_2O$), rubidium oxide ($Rb_2O$), strontium oxide (SrO), barium oxide (BaO), amorphous vanadium oxide (a-$V_2O_3$), amorphous chromium oxide (a-$Cr_2O_3$), amorphous gallium oxide (a-$Ga_2O_3$), amorphous iron oxide ($Fe_2O_3$), amorphous titanium oxide (a-$Ti_2O_3$), amorphous indium oxide (a-$In_2O_3$), yttrium aluminum oxide ($YAlO_3$), bismuth oxide ($Bi_2O_3$), ytterbium oxide ($Yb_2O_3$), dysprosium oxide ($Dy_2O_3$), gadolinium oxide ($Gd_2O_3$), strontium titanium oxide ($SrTiO_3$), dysprosium scandium oxide ($DyScO_3$), terbium scandium oxide ($TbScO_3$), gadolinium scandium oxide ($GdScO_3$), neodymium scandium oxide ($NdScO_3$), neodymium gallium oxide ($NdGaO_3$), lanthanum strontium aluminum tantalum oxide (LSAT), lanthanum strontium manganese oxide (LSMO), or the like. In some embodiments, the buffer layer 202 has a thickness between about 0.5 nanometers (nm) and about 5 nm.

The first ferroelectric structure 106 is disposed over the buffer layer 202 (e.g., disposed on a first side of the buffer layer 202). The first ferroelectric structure 106 may overlie, at least partially, the buffer layer 202. The first ferroelectric structure 106 overlies the first electrode structure 104. The first ferroelectric structure 106 may be or comprise, for example, hafnium zirconium oxide (HfZrO), scandium-doped aluminum nitride (AlScN), some other ferroelectric material, or a combination of the foregoing. In some embodiments, the first ferroelectric structure 106 is hafnium zirconium oxide (HfZrO). The first ferroelectric structure 106 may be hafnium zirconium oxide (HfZrO) and comprise oxygen vacancies. In some embodiments, the first ferroelectric structure 106 is hafnium zirconium oxide (HfZrO) that is doped with aluminum (Al), silicon (Si), lanthanum (La), scandium (Sc), calcium (Ca), barium (Ba), gadolinium (Gd), yttrium (Y), strontium (Sr), or the like. In some embodiments, the first ferroelectric structure 106 may have a thickness between about 0.1 nm and about 100 nm. In some embodiments, the first ferroelectric structure 106 is referred to as a first ferroelectric memory structure.

In some embodiments, the first ferroelectric structure 106 is hafnium zirconium oxide ($Hf_xZr_{1-x}O_y$), where X is between 0 and 1. In further embodiments, the first ferroelectric structure 106 is hafnium zirconium oxide ($Hf_{0.5}Zr_{0.5}O_2$). In yet further embodiments, the first ferroelectric structure 106 may have four different crystal phases: an orthorhombic phase (o-phase), a monoclinic phase (m-phase), a tetragonal phase (t-phase), and a cubic phase (cubic-phase). In yet further embodiments, the monoclinic phase may be less than fifth percent (50%) of a combination of the four crystal phases of the first ferroelectric structure 106.

The first blocking structure 108 is disposed vertically between the first ferroelectric structure 106 and the channel structure 110. The first blocking structure 108 is disposed vertically between the pair of S/D structures 120 and the first ferroelectric structure 106. The first blocking structure 108 vertically separates the channel structure 110 and the pair of S/D structures 120 from the first ferroelectric structure 106. The first blocking structure 108 may overlie, at least partially, the first ferroelectric structure 106. The first blocking structure 108 electrically isolates the first ferroelectric structure 106 from the channel structure 110. In some embodiments, the first blocking structure 108 may reduce leakage current (from the channel structure 110) and/or reduces oxygen vacancies in the channel structure 110.

The first blocking structure 108 may be or comprise, for example, hafnium oxide ($HfO_2$), silicon doped hafnium oxide (HSO), hafnium zirconium oxide (HfZrO), silicon oxide ($SiO_2$), aluminum oxide ($Al_2O_3$), yttrium oxide ($Y_2O_3$), zirconium oxide ($ZrO_2$), magnesium oxide (MgO), or the like. In some embodiments, the first blocking structure 108 may comprise silicon (Si), magnesium (MG), aluminum (Al), yttrium (Y), yttrium oxide ($Y_2O_3$), lanthanum (La), strontium (Sr), gadolinium (Gd), nitrogen (N), scandium (Sc), calcium (Ca), or the like. In some embodiments, the first blocking structure 108 has a thickness between about 0.1 nm and about 10 nm. In some embodiments, the first blocking structure 108 is silicon doped hafnium oxide (HSO) and comprises at least 10% silicon atoms. In some embodiments, the first blocking structure 108 is a bi-layer structure comprising a silicon doped hafnium oxide (HSO) layer and a hafnium zirconium oxide (HfZrO) layer. In such embodiments, the hafnium zirconium oxide (HfZrO) layer may have a thickness of about 1 nm.

The channel structure 110 comprises the plurality of individual channel structures 116 and the plurality of insulator structures 118. The plurality of individual channel structures 116 and the plurality of insulator structures 118 are vertically alternately stacked. The plurality of individual channel structures 116 and the plurality of insulator structures 118 are disposed over the first blocking structure 108 (e.g., on the first side of the first blocking structure 108). The plurality of individual channel structures 116 and the plurality of insulator structures 118 may overlie, at least partially, the first blocking structure 108.

The plurality of individual channel structures 116 are or comprise a semiconductor material. In some embodiments, the plurality of individual channel structures 116 are or comprise, for example, indium gallium zinc oxide (IGZO); amorphous indium gallium zinc oxide (a-IGZO); silicon (Si); silicon-germanium (SiGe); a group III-V semiconductor; gallium arsenide (GaAs); gallium arsenide indium (GaAsIn); a group II-VI semiconductor; zinc oxide (ZnO); magnesium oxide (MgO); gadolinium oxide (GdO); gallium oxide (GaO); indium oxide (InO); a compound semiconductor; amorphous silicon (a-Si); polycrystalline silicon; or some other suitable material. In some embodiments, the plurality of individual channel structures 116 have thicknesses between about 0.1 nm and about 100 nm. In some embodiments, each of the plurality of individual channel structures 116 may have a same chemical composition.

The plurality of insulator structures 118 electrically isolate the plurality of individual channel structures 116 from one another. The plurality of insulator structures 118 are or comprise, for example, aluminum oxide ($Al_2O_3$), silicon oxide ($SiO_2$), magnesium oxide (MgO), calcium oxide (CaO), yttrium oxide ($Y_2O_3$), zirconium oxide ($ZrO_2$), hafnium oxide ($HfO_2$), zirconium silicon oxide ($ZrSiO_4$), hafnium silicon oxide ($HfSiO_4$), or the like. In some embodiments, the plurality of insulator structures 118 may be doped with silicon (Si), magnesium (Mg), aluminum (Al), lanthanum (La), strontium (Sr), gadolinium (Gd), nitrogen (N), scandium (Sc), calcium (Ca), or the like. In some embodiments, the plurality of insulator structures 118 may be a compound comprising silicon (Si), magnesium (Mg), aluminum (Al), lanthanum (La), strontium (Sr), gadolinium (Gd), nitrogen (N), scandium (Sc), calcium (Ca), or the like. In some embodiments, the plurality of insulator structures 118 have thicknesses between about 0.1 nm and about 20 nm. In further embodiments, the channel structure 110 has a thickness (e.g., a combination of the thicknesses of the plurality of individual channel structures 116 and the plurality of insulator structures 118) between about 3 nm and about 200 nm. In some embodiments, each of the plurality of insulator structures 118 may have a same chemical composition.

The passivation structure 112 may overlie, at least partially, the channel structure 110. The passivation structure 112 may be or comprise, for example, silicon oxide ($SiO_2$), aluminum oxide ($Al_2O_3$), a low-k dielectric, some other dielectric material, or a combination of the foregoing.

The pair of S/D structures 120 extend vertically through the passivation structure 112. The pair of S/D structures 120 may extend vertically through the first dielectric layer 114. The pair of S/D structures 120 extend, at least partially, vertically through the channel structure 110. In some embodiments, the pair of S/D structures 120 extend through (e.g., completely through) the channel structure 110, such that a lower surface of the first S/D structure 120*a* and a lower surface of the second S/D structure 120*b* contact (e.g., directly contact) the first blocking structure 108. The pair of S/D structures 120 may overlie, at least partially, the first blocking structure 108. The pair of S/D structures 120 may be or comprise, for example, aluminum (Al) titanium (Ti), tantalum (Ta), tungsten (W), gold (Au), ruthenium (Ru), some other conductive material, or a combination of the foregoing.

The first dielectric layer 114 is disposed over the channel structure 110. The passivation structure 112 may be disposed vertically between the channel structure 110 and the first dielectric layer 114. The first dielectric layer 114 may be or comprise, for example, a low-k dielectric, an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), fluorine-doped silicon dioxide, organosilicate glass (OSG), carbon-doped oxide (CDO), porous silicon dioxide, porous OSG, porous CDO, a spin-on organic polymeric dielectric, a spin-on silicon based polymeric dielectric, or the like. In some embodiments, the first dielectric layer 114 is an IMD layer. In further embodiments, upper surfaces of the pair of S/D structures 120 may be substantially co-planar with an upper surface of the first dielectric layer 114.

The plurality of selectively-conductive channels 122 (see, FIG. 1) are not illustrated in the cross-sectional view 200 of FIG. 2 (or in subsequent figures) for clarity in the figures. However, it will be appreciated that the plurality of selectively-conductive channels 122 are disposed in the plurality of individual channel structures 116, respectively. Further, while the cross-sectional view 200 of FIG. 2 illustrates the plurality of individual channel structures 116 comprising 4 individual channel structures (e.g., the first individual channel structure 116*a*, the second individual channel structure 116*b*, the third individual channel structure 116*c*, and the fourth individual channel structure 116*d*), it will be appreciated that the plurality of individual channel structures 116 may comprise some other number of individual channel structures. Likewise, while the cross-sectional view 200 of FIG. 2 illustrates the plurality of insulator structures 118 comprising 3 insulator structures (e.g., the first insulator structure 118*a*, the second insulator structure 118*b*, and the third insulator structure 118*c*), it will be appreciated that the plurality of insulator structures 118 may comprise some other number of insulator structures.

More specifically, the plurality of individual channel structures 116 comprising N individual channel structures, where N is any number greater than 2. In some embodiments, N is between 2 and 20. The plurality of insulator structures 118 comprise N−1 insulator structures. For example, as shown in the cross-sectional view 200 of FIG. 2, N is equal to 4. Further, the lower surface of the first S/D structure 120*a* and the lower surface of the second S/D structure 120*b* are both disposed nearer the first ferroelectric structure 106 than at least 2 of the N individual channel structure. For example, as shown in the cross-sectional view 200 of FIG. 2, the lower surface of the first S/D structure 120*a* and the lower surface of the second S/D structure 120*b* are both disposed nearer the first ferroelectric structure 106 than each of the 4 individual channel structures. In some embodiments, the lower surface of the first S/D structure 120*a* and the lower surface of the second S/D structure 120*b* are both disposed nearer the first ferroelectric structure 106 than at least 1 of the N−1 insulator structures. For example, as shown in the cross-sectional view 200 of FIG. 2, the lower surface of the first S/D structure 120*a* and the lower surface of the second S/D structure 120*b* are both disposed nearer the first ferroelectric structure 106 than each of the 3 individual channel structures. In some embodiments, each of the N−1 insulator structures may be disposed vertically between an uppermost individual channel structure of the N individual channel structures and a lowermost individual channel structure of the N individual channel structures.

Figure 3:
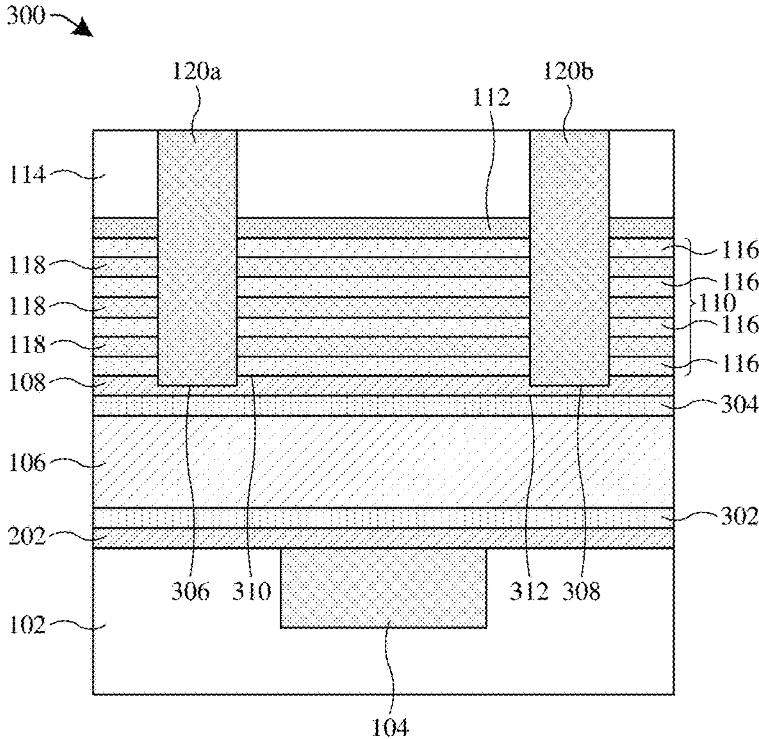
FIG. 3 illustrates a cross-sectional view of some other embodiments of the multi-channel ferroelectric memory structure of FIG. 2.

FIG. 3 illustrates a cross-sectional view 300 of some other embodiments of the multi-channel ferroelectric memory structure of FIG. 2.

As shown in the cross-sectional view 300 of FIG. 3, in some embodiments, a first seed layer 302 is disposed vertically between the buffer layer 202 and the first ferroelectric structure 106. The first seed layer 302 is configured to promote the orthorhombic phase (o-phase) of the first ferroelectric structure 106. In some embodiments, the first seed layer 302 is disposed vertically between the first electrode structure 104 and the first ferroelectric structure 106. In further embodiments, the buffer layer 202 has a lattice constant that is between a lattice constant of the first electrode structure 104 and a lattice constant of the first seed layer 302.

In some embodiments, a second seed layer 304 is disposed vertically between the first ferroelectric structure 106 and the first blocking structure 108. The second seed layer 304 is configured to promote the orthorhombic phase (o-phase) of the first ferroelectric structure 106.

The first seed layer 302 and the second seed layer 304 may be or comprise, for example, zirconium oxide ($ZrO_2$), yttrium oxide ($Y_2O_3$), zirconium yttrium oxide (ZrYO), hafnium oxide ($HfO_2$), aluminum oxide ($Al_2O_3$), hafnium zirconium oxide ($Hf_xZr_{1-x}O_y$), some other suitable material, or a combination of the foregoing. In some embodiments, the first seed layer 302 and the second seed layer 304 may be cubic-phase, t-phase, and/or o-phase zirconium oxide (ZrO); cubic-phase, t-phase, and/or o-phase yttrium oxide (ZrYO); cubic-phase, t-phase, and/or o-phase hafnium oxide ($HfO_2$); cubic-phase, t-phase, and/or o-phase aluminum oxide ($Al_2O_3$); or the like. In some embodiments, the first seed layer 302 may have a thickness between about 0.1 nm and about 5 nm. In some embodiments, the second seed layer 304 may have a thickness between about 0.1 nm and about 5 nm. In some embodiments, the first seed layer 302 and/or the second seed layer 304 may comprise one or more layers (e.g., a multi-layered seed layer).

Also shown in the cross-sectional view 300 of FIG. 3, the first S/D structure 120*a* has a lower surface 306 and the second S/D structure 120*b* has a lower surface 308. The lower surface 306 of the first S/D structure 120*a* and the lower surface 308 of the second S/D structure 120*b* may both be disposed vertically between an upper surface 310 of the first blocking structure 108 and a lower surface 312 of the first blocking structure 108. In other embodiments, the lower surface 306 of the first S/D structure 120*a* and the lower surface 308 of the second S/D structure 120*b* may both be co-planar with the upper surface 310 of the first blocking structure 108.

Figure 4:
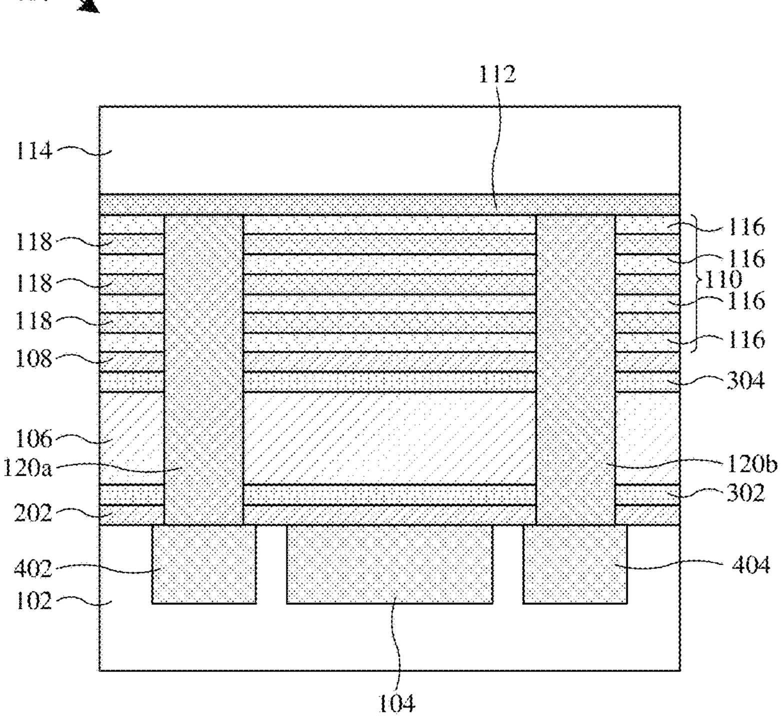
FIG. 4 illustrates a cross-sectional view of some other embodiments of the multi-channel ferroelectric memory structure of FIG. 3.

FIG. 4 illustrates a cross-sectional view 400 of some other embodiments of the multi-channel ferroelectric memory structure of FIG. 3.

As shown in the cross-sectional view 400 of FIG. 4, in some embodiments, a first conductive structure 402 and a second conductive structure 404 are disposed in the substrate 102. In some embodiments, the first S/D structure 120*a* is electrically coupled to the first conductive structure 402 and the plurality of individual channel structures 116.

The second S/D structure **120*b* may be electrically coupled to the second conductive structure 404 and the plurality of individual channel structures 116. In some embodiments, the first conductive structure 402 and the second conductive structure 404 are conductive structures of an interconnect structure (e.g., copper interconnect structure) that is at least partially embedded in the substrate 102. For example, the first conductive structure 402 may be a conductive via (e.g., metal via) or a conductive wire (e.g., metal wire) of the interconnect structure. In some embodiments, the first conductive structure 402 and the second conductive structure 404** may be or comprise, for example, copper (Cu), aluminum (Al), tungsten (W), tantalum (Ta), titanium (Ti), gold (Au), some other metal, or a combination of the foregoing.

In some embodiments, the first S/D structure **120*a* extends vertically from the first conductive structure 402 to the channel structure 110. In further embodiments, the first S/D structure 120*a* extends vertically from the first conductive structure 402 to the passivation structure 112. In some embodiments, the second S/D structure 120*b* extends vertically from the second conductive structure 404 to the channel structure 110. In further embodiments, the second S/D structure 120*b* extends vertically from the second conductive structure 404 to the passivation structure 112. In some embodiments, the first S/D structure 120*a* and/or the second S/D structure 120*b* may extend vertically through the buffer layer 202, the first seed layer 302, the first ferroelectric structure 106, the second seed layer 304, and the channel structure 110. The passivation structure 112 may overlie both the first S/D structure 120*a* and the second S/D structure 120*b***.

Figure 5:
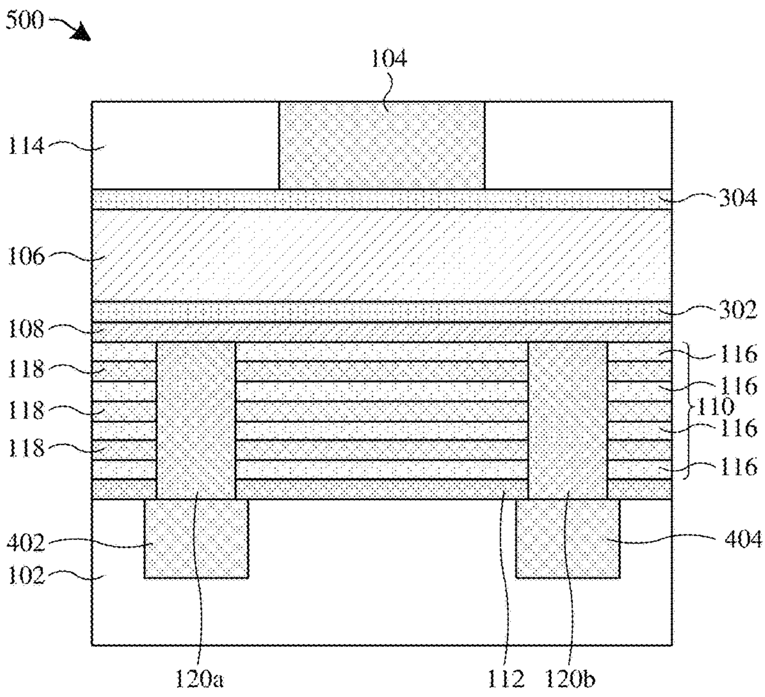
FIG. 5 illustrates a cross-sectional view of some other embodiments of the multi-channel ferroelectric memory structure of FIG. 4.

FIG. 5 illustrates a cross-sectional view 500 of some other embodiments of the multi-channel ferroelectric memory structure of FIG. 4.

As shown in the cross-sectional view 500 of FIG. 5, in some embodiments, the channel structure 110 is disposed over the passivation structure 112. The first blocking structure 108 may be disposed over the channel structure 110 and the pair of S/D structures 120. The first seed layer 302 may be disposed over the first blocking structure 108. The first ferroelectric structure 106 may be disposed over the first seed layer 302. The second seed layer 304 may be disposed over the first ferroelectric structure 106. The first electrode structure 104 may be disposed over the first ferroelectric structure 106 and the second seed layer 304. The first dielectric layer 114 may be disposed over the first ferroelectric structure 106 and the second seed layer 304. The first electrode structure 104 may be disposed within the first dielectric layer 114. The first electrode structure 104 is disposed laterally between the first S/D structure **120*a* and the second S/D structure 120*b***.

Figure 6:
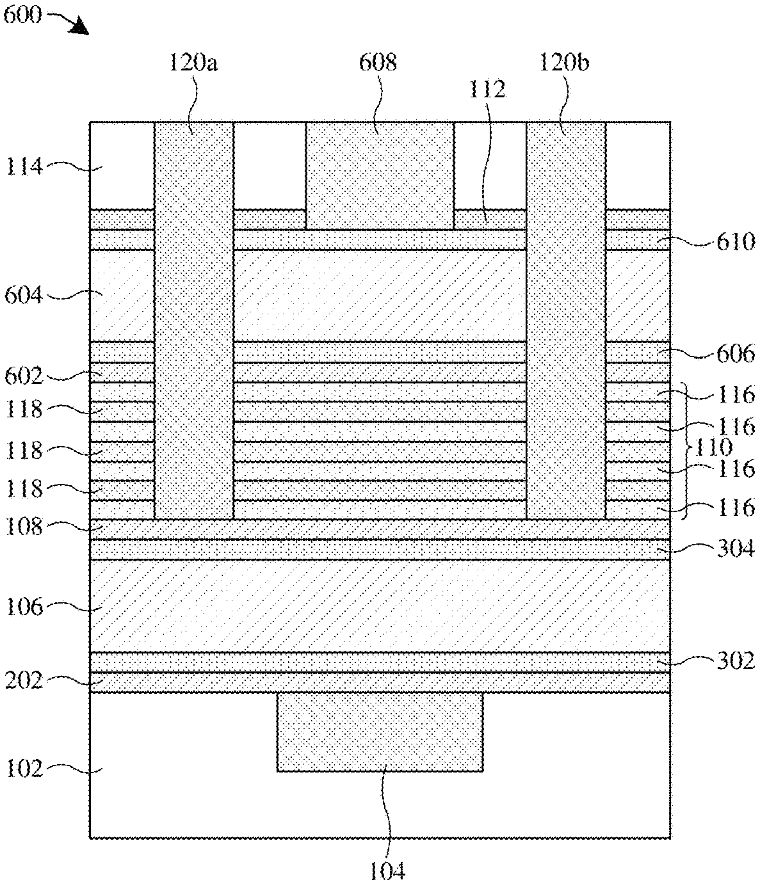
FIG. 6 illustrates a cross-sectional view of some other embodiments of the multi-channel ferroelectric memory structure of FIG. 4.

FIG. 6 illustrates a cross-sectional view 600 of some other embodiments of the multi-channel ferroelectric memory structure of FIG. 4.

As shown in the cross-sectional view 600 of FIG. 6, in some embodiments, a second blocking structure 602 is disposed over the channel structure 110 (e.g., disposed on the first side of the channel structure 110). A second ferroelectric structure 604 is disposed over the second blocking structure 602 (e.g., disposed on a first side of the second blocking structure 602). The second blocking structure 602 is disposed vertically between the second ferroelectric structure 604 and the channel structure 110. The channel structure 110 is disposed vertically between the second ferroelectric structure 604 and the first ferroelectric structure 106. Further, the second ferroelectric structure 604 is disposed on a first side (e.g., a top side) of the channel structure 110 and the first ferroelectric structure 106 is disposed on a second side (e.g., a bottom side) of the channel structure 110 opposite the first side. In some embodiments, a third seed layer 606 is disposed vertically between the second blocking structure 602 and the second ferroelectric structure 604. In other embodiments, the third seed layer 606 is omitted. In some embodiments, the second ferroelectric structure 604 is referred to as a second ferroelectric memory structure.

A second electrode structure 608 is disposed over the second ferroelectric structure 604 (e.g., disposed on a first side of the second ferroelectric structure 604). The second electrode structure 608 is disposed laterally between the first S/D structure **120*a* and the second S/D structure 120*b*. The second electrode structure 608 may be disposed in the first dielectric layer 114. In some embodiments, the second electrode structure 608 is also disposed, at least partially, in the passivation structure 112. In further embodiments, the second electrode structure 608 extends through (e.g., completely through) the passivation structure 112. The second ferroelectric structure 604 is disposed vertically between the second electrode structure 608 and the channel structure 110. In some embodiments, a fourth seed layer 610 is disposed vertically between the second ferroelectric structure 604 and the second electrode structure 608. In other embodiments, the fourth seed layer 610 is omitted. In some embodiments, the second electrode structure 608 is referred to as an upper electrode structure and the first electrode structure 104** is referred to as a lower electrode structure.

The pair of S/D structures 120 extend vertically through the passivation structure 112 to the channel structure 110. The pair of S/D structures 120 extend vertically through the fourth seed layer 610 to the channel structure 110. The pair of S/D structures 120 extend vertically through the second ferroelectric structure 604 to the channel structure 110. The pair of S/D structures 120 extend vertically through the third seed layer 606 to the channel structure 110. The pair of S/D structures 120 extend vertically through the second blocking structure 602 to the channel structure 110.

The second blocking structure 602 may be or comprise, for example, hafnium oxide ($HfO_2$), silicon doped hafnium oxide (HSO), hafnium zirconium oxide (HfZrO), silicon oxide ($SiO_2$), aluminum oxide ($Al_2O_3$), yttrium oxide ($Y_2O_3$), zirconium oxide ($ZrO_2$), magnesium oxide (MgO), or the like. In some embodiments, the second blocking structure 602 may comprise silicon (Si), magnesium (MG), aluminum (Al), yttrium (Y), yttrium oxide ($Y_2O_3$), lanthanum (La), strontium (Sr), gadolinium (Gd), nitrogen (N), scandium (Sc), calcium (Ca), or the like. In some embodiments, the second blocking structure 602 has a thickness between about 0.1 nm and about 10 nm. In some embodiments, the second blocking structure 602 is silicon doped hafnium oxide (HSO) and comprises at least 10% silicon atoms. In some embodiments, the second blocking structure 602 is a bi-layer structure comprising a silicon doped hafnium oxide (HSO) layer and a hafnium zirconium oxide (HfZrO) layer. In such embodiments, the hafnium zirconium oxide (HfZrO) layer may have a thickness of about 1 nm.

The third seed layer 606 and the fourth seed layer 610 may be or comprise, for example, zirconium oxide ($ZrO_2$), yttrium oxide ($Y_2O_3$), zirconium yttrium oxide (ZrYO), hafnium oxide ($HfO_2$), aluminum oxide ($Al_2O_3$), hafnium zirconium oxide ($Hf_xZr_{1-x}O_y$), some other suitable material, or a combination of the foregoing. In some embodiments, the third seed layer 606 and the fourth seed layer 610 may be cubic-phase, t-phase, and/or o-phase zirconium oxide (ZrO); cubic-phase, t-phase, and/or o-phase yttrium oxide (ZrYO); cubic-phase, t-phase, and/or o-phase hafnium oxide ($HfO_2$); cubic-phase, t-phase, and/or o-phase aluminum oxide ($Al_2O_3$); or the like. In some embodiments, the third seed layer 606 may have a thickness between about 0.1 nm and about 5 nm. In some embodiments, the fourth seed layer 610 may have a thickness between about 0.1 nm and about 5 nm. In some embodiments, the third seed layer 606 and/or the fourth seed layer 610 may comprise one or more layers (e.g., a multi-layered seed layer).

The second ferroelectric structure 604 may be or comprise, for example, hafnium zirconium oxide (HfZrO), scandium-doped aluminum nitride (AlScN), some other ferroelectric material, or a combination of the foregoing. In some embodiments, the second ferroelectric structure 604 is hafnium zirconium oxide (HfZrO). The second ferroelectric structure 604 may be hafnium zirconium oxide (HfZrO) and comprise oxygen vacancies. In some embodiments, second ferroelectric structure 604 is hafnium zirconium oxide (HfZrO) that is doped with aluminum (Al), silicon (Si), lanthanum (La), scandium (Sc), calcium (Ca), barium (Ba), gadolinium (Gd), yttrium (Y), strontium (Sr), or the like. In some embodiments, the second ferroelectric structure 604 may have a thickness between about 0.1 nm and about 100 nm.

In some embodiments, the second ferroelectric structure 604 is hafnium zirconium oxide ($Hf_xZr_{1-x}O_y$), where X is between 0 and 1. In further embodiments, the second ferroelectric structure 604 is hafnium zirconium oxide ($Hf_{0.5}Zr_{0.5}O_2$). In yet further embodiments, the second ferroelectric structure 604 may have four different crystal phases: an orthorhombic phase (o-phase), a monoclinic phase (m-phase), a tetragonal phase (t-phase), and a cubic phase (cubic-phase). In yet further embodiments, the monoclinic phase may be less than fifth percent (50%) of a combination of the four crystal phases of the second ferroelectric structure 604.

The second electrode structure 608 may be or comprise, for example, platinum (Pt), titanium (Ti), titanium nitride (TiN), tantalum (Ta), tantalum nitride (TaN), tungsten (W), tungsten nitride (WN), gold (Au), iron (Fe), nickel (Ni), beryllium (Be), chromium (Cr), cobalt (Co), antimony (Sb), iridium (Ir), molybdenum (Mo), osmium (Os), thorium (Th), vanadium (V), some other metal or metal nitride, or a combination of the foregoing. In some embodiments, the second electrode structure 608 is referred to as a second gate electrode. In some embodiments, the structure illustrated in the cross-sectional view 600 of FIG. 6 is referred to as a double-gate, multi-channel ferroelectric memory structure (e.g., double-gate, multi-channel ferroelectric memory cell).

Figure 7:
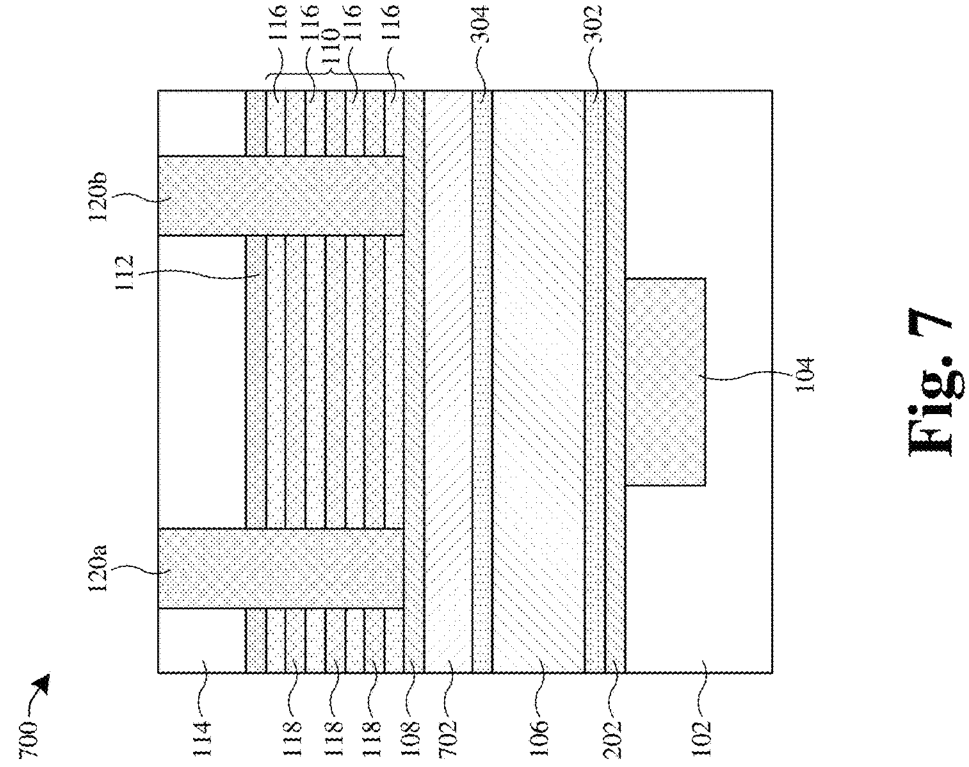
FIG. 7 illustrates a cross-sectional view of some other embodiments of the multi-channel ferroelectric memory structure of FIG. 4.

FIG. 7 illustrates a cross-sectional view 700 of some other embodiments of the multi-channel ferroelectric memory structure of FIG. 4.

As shown in the cross-sectional view 700 of FIG. 7, the channel structure 110 is disposed over a first floating electrode structure 702. The first floating electrode structure 702 is disposed vertically between the first blocking structure 108 and the first ferroelectric structure 106. In some embodiments, the first floating electrode structure 702 is disposed vertically between the first blocking structure 108 and the second seed layer 304. The first floating electrode structure 702 may be or comprise, for example, titanium (Ti), titanium nitride (TiN), tungsten (W), tungsten nitride (WN), tantalum (Ta), tantalum nitride (TaN), platinum (Pt), gold (Au), or the like. In some embodiments, the first floating electrode structure 702 has a thickness between about 1 nm and about 50 nm. In some embodiments, the structure illustrated in the cross-sectional view 700 of FIG. 7 is referred to as a metal-ferroelectric-metal-insulator-semiconductor (MFMIS) ferroelectric memory structure (e.g., metal-ferroelectric-metal-insulator-semiconductor ferroelectric random-access memory (MFMIS FeRAM) cell).

Figure 8:
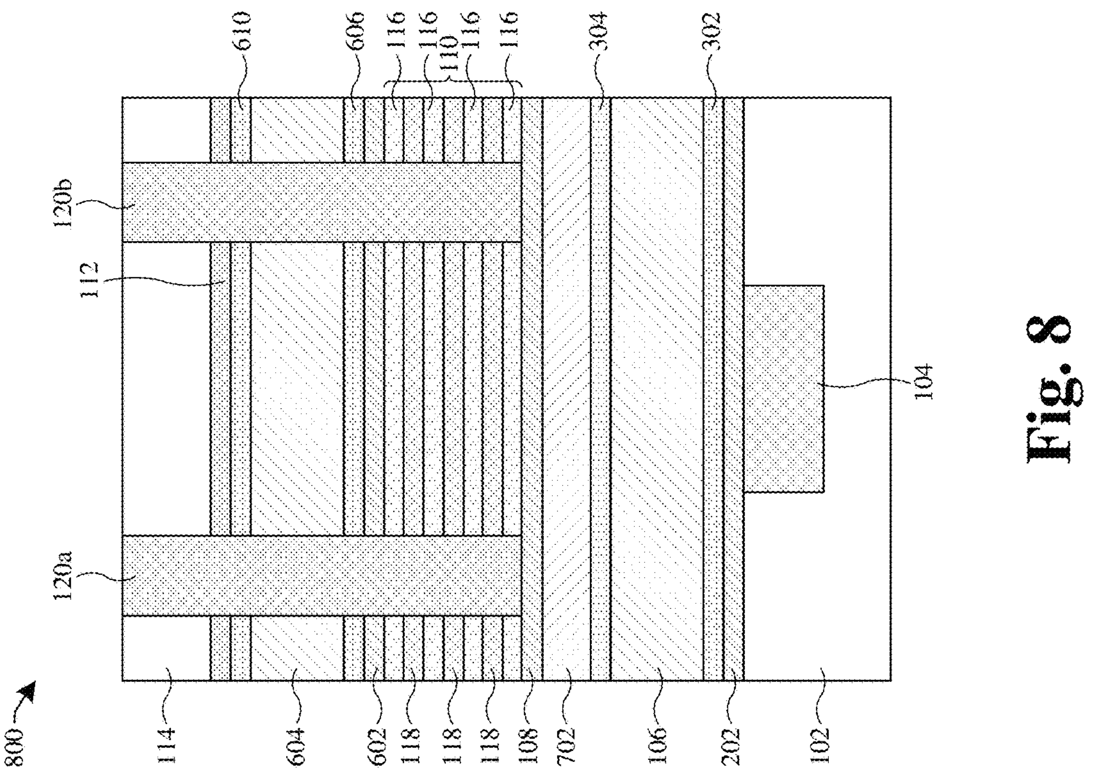
FIG. 8 illustrates a cross-sectional view of some other embodiments of the multi-channel ferroelectric memory structure of FIG. 7.

FIG. 8 illustrates a cross-sectional view 800 of some other embodiments of the multi-channel ferroelectric memory structure of FIG. 7.

As shown in the cross-sectional view 800 of FIG. 8, in some embodiments, the channel structure 110 is disposed vertically between the first floating electrode structure 702 and the second ferroelectric structure 604. The second blocking structure 602 may be disposed vertically between the first floating electrode structure 702 and the second ferroelectric structure 604.

Figure 9:
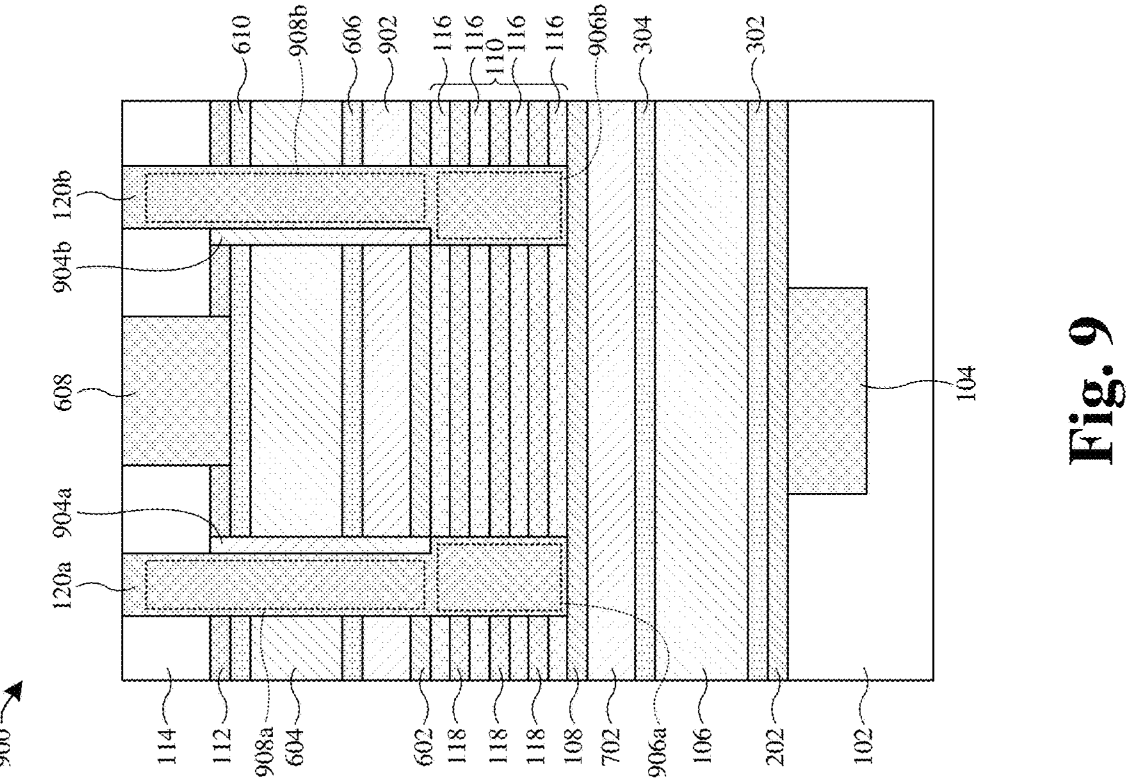
FIG. 9 illustrates a cross-sectional view of some other embodiments of the multi-channel ferroelectric memory structure of FIG. 8.

FIG. 9 illustrates a cross-sectional view 900 of some other embodiments of the multi-channel ferroelectric memory structure of FIG. 8.

As shown in the cross-sectional view 900 of FIG. 9, a second floating electrode structure 902 is disposed over the channel structure 110. The second floating electrode structure 902 is disposed vertically between the second blocking structure 602 and the second ferroelectric structure 604. In some embodiments, the second floating electrode structure 902 is disposed vertically between the second blocking structure 602 and the third seed layer 606. The second floating electrode structure 902 may be or comprise, for example, titanium (Ti), titanium nitride (TiN), tungsten (W), tungsten nitride (WN), tantalum (Ta), tantalum nitride (TaN), platinum (Pt), gold (Au), or the like. In some embodiments, the second floating electrode structure 902 has a thickness between about 1 nm and about 50 nm.

A plurality of spacer structures 904 are disposed over the channel structure 110 (e.g., on the first side of the channel structure 110). For example, a first spacer structure **904*a* and a second spacer structure 904*b* are disposed over the channel structure 110. The plurality of spacer structures 904 overlie lower portions 906 of the pair of S/D structures 120. For example, the first spacer structure 904*a* overlies a lower portion 906*a* of the first S/D structure 120*a*, and the second spacer structure 904*b* overlies a lower portion 906*b* of the second S/D structure 120*b*. In some embodiments, the lower portions 906 of the pair of S/D structures 120 are wider (e.g., have a greater width) than upper portions 908 of the pair of S/D structures 120. For example, an upper portion 908*a* of the first S/D structure 120*a* overlies the lower portion 906*a* of the first S/D structure 120*a*, and an upper portion 908*b* of the second S/D structure 120*b* overlies the lower portion 906*b* of the second S/D structure 120*b*. The lower portion 906*a* of the first S/D structure 120*a* has a width (e.g., distance between opposite sidewalls) that is greater than a width of the upper portion 908*a* of the first S/D structure 120*a*, and the lower portion 906*b* of the second S/D structure 120*b* has a width that is greater than a width of the upper portion 908*b* of the second S/D structure 120*b*. The upper portion 908*a* of the first S/D structure 120*a* may have a sidewall that is laterally offset from a corresponding sidewall of the lower portion 906*a* of the first S/D structure 120*a*. The upper portion 908*b* of the second S/D structure 120*b* may also have a sidewall that is laterally offset from a corresponding sidewall of the lower portion 906*b* of the second S/D structure 120*b***.

The plurality of spacer structures 904 are disposed along sidewalls of the upper portions 908 of the pair of S/D structures 120. The plurality of spacer structures 904 extend vertically along the sidewalls of the upper portions 908 of the pair of S/D structures 120. The plurality of spacer structures 904 are disposed laterally between the upper portions 908 of the pair of S/D structures 120 and surrounding structural features (e.g., the second ferroelectric structure 604, the second floating electrode structure 902, the second electrode structure 608, the third seed layer 606, the fourth seed layer 610, the passivation structure 112, etc.). The plurality of spacer structures 904 are configured to electrically isolate the pair of S/D structures 120 from the second floating electrode structure 902 (e.g., a central portion of the second floating electrode structure 902).

For example, the first spacer structure 904*a* is disposed along an outer sidewall of the upper portion 908*a* of the first S/D structure 120*a*. The first spacer structure 904*a* extends vertically along the outer sidewalls of the upper portion 908*a* of the first S/D structure 120*a*. The first spacer structure 904*a* is disposed laterally between the upper portion 908*a* of the first S/D structure 120*a* and the second floating electrode structure 902, and the first spacer structure 904*a* electrically isolates the first S/D structure 120*a* from the second floating electrode structure 902 (e.g., the central portion of the second floating electrode structure 902). Likewise, the second spacer structure 904*b* is disposed along an outer sidewall of the upper portion 908*b* of the second S/D structure 120*b*. The second spacer structure 904*b* extends vertically along the outer sidewalls of the upper portion 908*b* of the second S/D structure 120*b*. The second spacer structure 904*b* is disposed laterally between the second S/D structure 120*b* and the second floating electrode structure 902, and the second spacer structure 904*b* electrically isolates the second S/D structure 120*b* from the second floating electrode structure 902 (e.g., the central portion of the second floating electrode structure 902).

In some embodiments, the plurality of spacer structures 904 extend vertically through the passivation structure 112. The plurality of spacer structures 904 may extend vertically through the fourth seed layer 610. The plurality of spacer structures 904 may extend vertically through the second ferroelectric structure 604. The plurality of spacer structures 904 may extend vertically through the third seed layer 606. The plurality of spacer structures 904 extend vertically through the second floating electrode structure 902. In some embodiments, the plurality of spacer structures 904 extend vertically through the second blocking structure 602.

The second electrode structure 608 is disposed laterally between the first spacer structure 904*a* and the second spacer structure 904*b*. In some embodiments, portions of the passivation structure 112 are disposed laterally between (e.g., directly laterally between) the plurality of spacer structures 904 and the second electrode structure 608. In other embodiments, the plurality of spacer structures 904 may contact (e.g., directly contact) the second electrode structure 608. The plurality of spacer structures 904 may be or comprise, for example, an oxide (e.g., $SiO_2$), a nitride (e.g., SiN), an oxy-nitride (e.g., SiON), some other dielectric material, or a combination of the foregoing.

Figure 10:
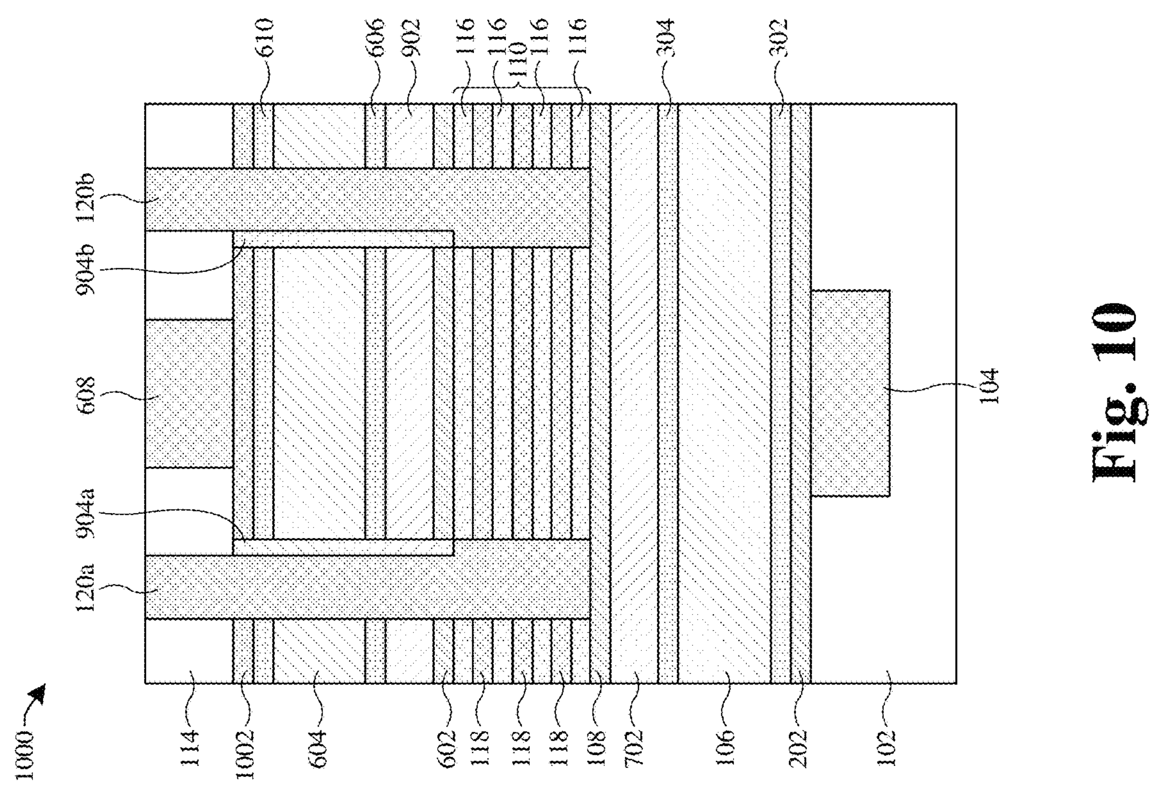
FIG. 10 illustrates a cross-sectional view of some other embodiments of the multi-channel ferroelectric memory structure of FIG. 9.

FIG. 10 illustrates a cross-sectional view 1000 of some other embodiments of the multi-channel ferroelectric memory structure of FIG. 9.

As shown in the cross-sectional view 1000 of FIG. 10, a metal structure 1002 may be disposed over the second ferroelectric structure 604 (e.g., on the first side of the second ferroelectric structure 604). The metal structure 1002 is disposed vertically between the second electrode structure 608 and the second ferroelectric structure 604. The metal structure 1002 is also disposed vertically between the first dielectric layer 114 and the second ferroelectric structure 604. In some embodiments, the metal structure 1002 is disposed vertically between the second electrode structure 608 (and the first dielectric layer 114) and the fourth seed layer 610. The metal structure 1002 is electrically coupled to the second electrode structure 608.

The plurality of spacer structures 904 extend vertically through the metal structure 1002. The pair of S/D structures 120 also extend vertically through the metal structure 1002. The plurality of spacer structures 904 are disposed laterally between the pair of S/D structures 120 and the metal structure 1002 (e.g., a central portion of the metal structure 1002). The plurality of spacer structures 904 are configured to electrically isolate the pair of S/D structures 120 from the metal structure 1002 (e.g., the central portion of the metal structure 1002). The metal structure 1002 may be or comprise, for example, copper (Cu), aluminum (Al), platinum (Pt), titanium (Ti), tantalum (Ta), tungsten (W), gold (Au), some other metal material, or a combination of the foregoing. In some embodiments, the structure illustrated in the cross-sectional view 1000 of FIG. 10 is referred to as a double-MFMIS ferroelectric memory structure (e.g., double-MFMIS FeRAM cell).

Figure 11:
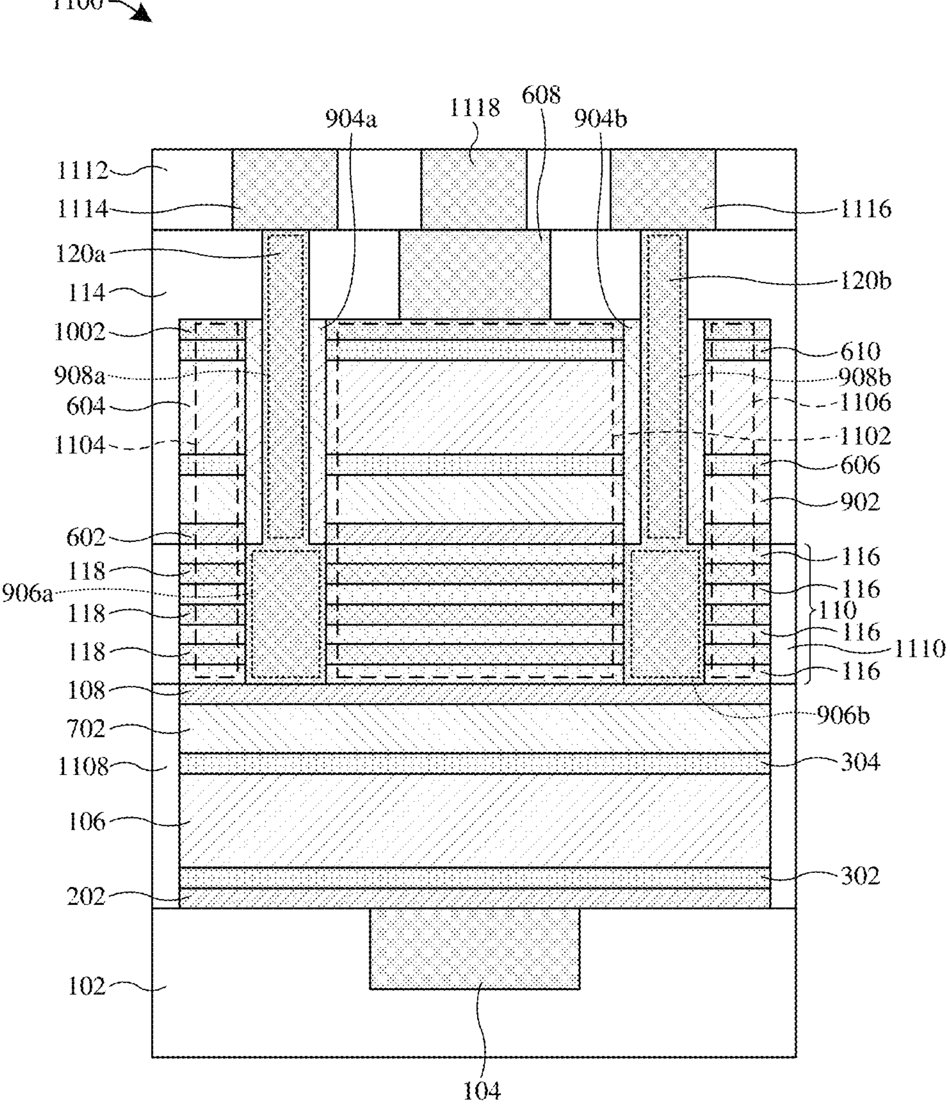
FIG. 11 illustrates a cross-sectional view of some other embodiments of the multi-channel ferroelectric memory structure of FIG. 10.

FIG. 11 illustrates a cross-sectional view 1100 of some other embodiments of the multi-channel ferroelectric memory structure of FIG. 10.

As shown in the cross-sectional view 1100 of FIG. 11, the plurality of spacer structures 904 may extend vertically along opposite sidewalls of the pair of S/D structures 120. For example, the first spacer structure 904*a* may extend vertically along a first sidewall of the upper portion 908*a* of the first S/D structure 120*a* and extend vertically along a second sidewall of the upper portion 908*a* of the first S/D structure 120*a* that is opposite the first sidewall of the upper portion 908*a* of the first S/D structure 120*a*. In some embodiments, the plurality of spacer structures 904 extend laterally around the pair of S/D structures 120, respectively, in closed loop paths. For example, the first spacer structure 904*a* extends laterally around the first S/D structure 120*a* in a closed loop path. In some embodiments, the upper portion 908*a* of the first S/D structure 120*a* may have opposite sidewalls that are laterally offset from corresponding opposite sidewalls of the lower portion 906*a* of the first S/D structure 120*a*. In some embodiments, the upper portion 908*b* of the second S/D structure 120*b* may also have opposite sidewalls that are laterally offset from corresponding opposite sidewalls of the lower portion 906*b* of the second S/D structure 120*b*.

Also shown in the cross-sectional view 1100 of FIG. 11, the multi-channel ferroelectric memory structure has a central region 1102, a first peripheral region 1104, and a second peripheral region 1106. The central region 1102 is disposed laterally between the first peripheral region 1104 and the second peripheral region 1106. The central region 1102 is disposed laterally between the first S/D structure 120*a* and the second S/D structure 120*b*. The central region 1102 extends laterally between the first S/D structure 120*a* (and the first spacer structure 904*a*) and the second S/D structure 120*b* (and the second spacer structure 904*b*). The first S/D structure 120*a* is disposed laterally between the central region 1102 and the first peripheral region 1104. The second S/D structure 120*b* is disposed laterally between the central region 1102 and the second peripheral region 1106. The first S/D structure 120*a*, the first spacer structure 904*a*, the central region 1102, the second spacer structure 904*b*, and the second S/D structure 120*b* are laterally disposed between the first peripheral region 1104 and the second peripheral region 1106.

The channel structure 110, the second blocking structure 602, the second floating electrode structure 902, the third seed layer 606, the second ferroelectric structure 604, the fourth seed layer 610, and/or the metal structure 1002 (or the passivation structure 112) may each be disposed in the central region 1102, the first peripheral region 1104, and the second peripheral region 1106. The channel structure 110, the second blocking structure 602, the second floating electrode structure 902, the third seed layer 606, the second ferroelectric structure 604, the fourth seed layer 610, and the metal structure 1002 (or the passivation structure 112) have portions that correspond to the regions in which they are disposed.

For example, the channel structure 110 has a central portion, a first peripheral portion, and a second peripheral portion. The central portion of the channel structure 110 comprises the portions of the channel structure 110 disposed in the central region 1102. The first peripheral portion of the channel structure 110 comprises the portions of the channel structure 110 disposed in the first peripheral region 1104. The second peripheral portion of the channel structure 110 comprises the portions of the channel structure 110 disposed in the second peripheral region 1106. More specifically, the plurality of individual channel structures 116 and the plurality of insulator structures 118 each have central portions that are disposed in the central region 1102, each have first peripheral portions that are disposed in the first peripheral region 1104, and each have second peripheral portions that are disposed in the second peripheral region 1106. The central portion of the channel structure 110 extends laterally between the first S/D structure **120*a* (and the first spacer structure 904*a*) and the second S/D structure 120*b* (and the second spacer structure 904*b*). The first S/D structure 120*a*, the first spacer structure 904*a*, the central region 1102, the second spacer structure 904*b*, and the second S/D structure 120*b* are laterally disposed between the first peripheral portion of the channel structure 110 and the second peripheral portion of the channel structure 110**.

Also shown in the cross-sectional view 1100 of FIG. 11, a second dielectric layer 1108 is disposed over the substrate 102. The buffer layer 202, the first seed layer 302, the first ferroelectric structure 106, the second seed layer 304, the first floating electrode structure 702, and the first blocking structure 108 may be disposed in the second dielectric layer 1108. A third dielectric layer 1110 is disposed over the second dielectric layer 1108. The channel structure 110 may be disposed in the third dielectric layer 1110. The first dielectric layer 114 is disposed over the third dielectric layer 1110. In some embodiments, the second blocking structure 602, the second floating electrode structure 902, the third seed layer 606, the second ferroelectric structure 604, the fourth seed layer 610, the metal structure 1002, the passivation structure 112, the second electrode structure 608, the pair of S/D structures 120, and the plurality of spacer structures 904 may be disposed in the first dielectric layer 114.

In some embodiments, a fourth dielectric layer 1112 is disposed over the first dielectric layer 114, the pair of S/D structures 120, and the second electrode structure 608. A third conductive structure 1114, a fourth conductive structure 1116, and a fifth conductive structure 1118 are disposed in the fourth dielectric layer 1112. The first S/D structure **120*a* is electrically coupled to the third conductive structure 1114. The second S/D structure 120*b* is electrically coupled to the fourth conductive structure 1116. The fifth conductive structure 1118 is electrically coupled to the second electrode structure 608**.

In some embodiments, the third conductive structure 1114, the fourth conductive structure 1116, and the fifth conductive structure 1118 are conductive structures of the interconnect structure (e.g., the copper interconnect structure) that is at least partially embedded in the substrate 102, the first dielectric layer 114, the second dielectric layer 1108, the third dielectric layer 1110, and the fourth dielectric layer 1112. For example, the third conductive structure 1114 may be a conductive via (e.g., metal via) or a conductive wire (e.g., metal wire) of the interconnect structure.

In some embodiments, the third conductive structure 1114, the fourth conductive structure 1116, and the fifth conductive structure 1118 may be or comprise, for example, copper (Cu), aluminum (Al), tungsten (W), tantalum (Ta), titanium (Ti), gold (Au), some other metal, or a combination of the foregoing. The second dielectric layer 1108, the third dielectric layer 1110, and the fourth dielectric layer 1112 may be or comprise, for example, a low-k dielectric, an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), fluorine-doped silicon dioxide, organosilicate glass (OSG), carbon-doped oxide (CDO), porous silicon dioxide, porous OSG, porous CDO, a spin-on organic polymeric dielectric, a spin-on silicon based polymeric dielectric, or the like. In some embodiments, the second dielectric layer 1108, the third dielectric layer 1110, and the fourth dielectric layer 1112 may be IMD layers.

FIGS. 12-29 illustrate a series of cross-sectional views 1200-2900 of some embodiments of a method for forming an integrated chip (IC) comprising a multi-channel ferroelectric memory structure. Although FIGS. 12-29 are described with reference to a method, it will be appreciated that the structures shown in FIGS. 12-29 are not limited to the method but rather may stand alone separate of the method.

Figure 12:
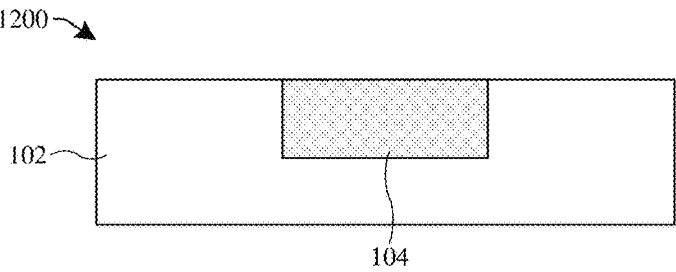
FIGS. 12-29 illustrate a series of cross-sectional views of some embodiments of a method for forming an integrated chip (IC) comprising a multi-channel ferroelectric memory structure.

As shown in cross-sectional view 1200 of FIG. 12, a first electrode structure 104 is formed in a substrate 102. In some embodiments, a process for forming the first electrode structure 104 comprises: forming an opening in the substrate 102 (e.g., via a photolithography/etching process); depositing a conductive layer in the opening and over an upper surface of the substrate 102; and planarizing the conductive layer to localize the conductive layer to the opening. Other suitable processes are, however, amenable. The conductive layer may be deposited by, for example, chemical vapor deposition (CVD), physical vapor deposition (PVD), atomic layer deposition (ALD), sputtering, electrochemical plating, electroless plating, some other deposition process, or a combination of the foregoing. It will be appreciated that, in some embodiments, the first electrode structure 104 and the substrate 102 are as described in the aforementioned figures. It will also be appreciated that the first electrode structure 104 may be formed so that the first electrode structure 104 is electrically coupled to an underlying conductive feature (e.g., a conductive feature of a copper interconnect structure).

Figure 13:
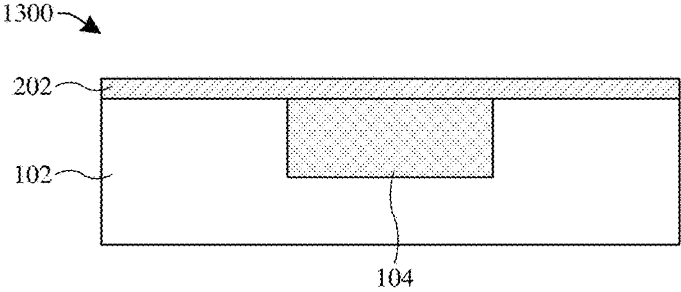

As shown in cross-sectional view 1300 of FIG. 13, a buffer layer 202 is formed over the first electrode structure 104 and the substrate 102. In some embodiments, formation of the buffer layer 202 is omitted. In some embodiments, a process for forming the buffer layer 202 comprises depositing the buffer layer 202 on the first electrode structure 104 and the substrate 102. The buffer layer 202 may be deposited by, for example, CVD, PVD, ALD, pulsed laser deposition (PLD), some other deposition process, or a combination of the foregoing. It will be appreciated that, in some embodiments, the buffer layer 202 is as described in the aforementioned figures.

Figure 14:
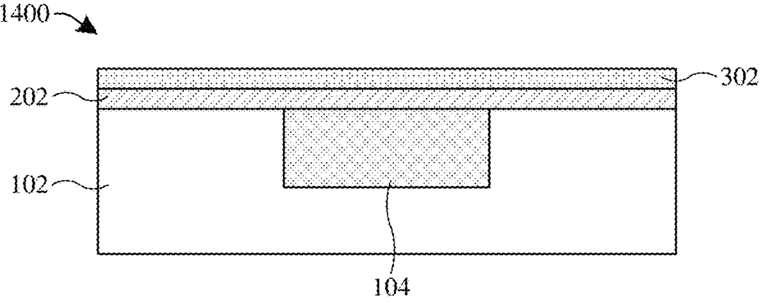

As shown in cross-sectional view 1400 of FIG. 14, a first seed layer 302 is formed over the buffer layer 202. In some embodiments, formation of the first seed layer 302 is omitted. In some embodiments, the buffer layer 202 is formed with a lattice constant that is between a lattice constant of the first seed layer 302 and a lattice constant of the first electrode structure 104. In some embodiments, a process for forming the first seed layer 302 comprises depositing the first seed layer 302 on the buffer layer 202. The first seed layer 302 may be deposited by, for example, CVD, PVD, ALD, some other deposition process, or a combination of the foregoing. It will be appreciated that, in some embodiments, the first seed layer 302 is as described in the aforementioned figures.

Figure 15:
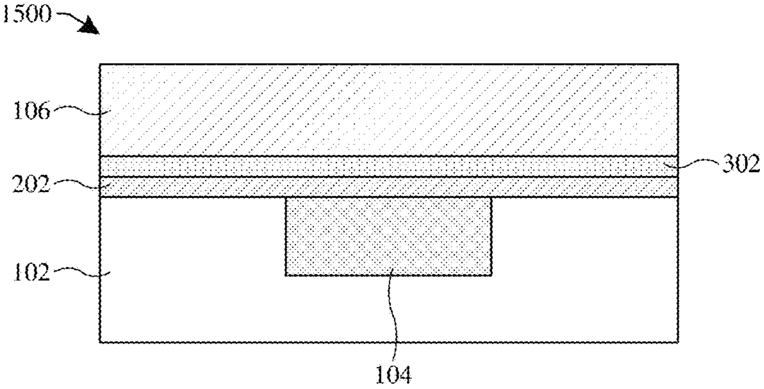

As shown in cross-sectional view 1500 of FIG. 15, a first ferroelectric structure 106 is formed over the first seed layer 302. In some embodiments, the first seed layer 302 is configured to promote the orthorhombic phase of the first ferroelectric structure 106. In some embodiments, a process for forming the first ferroelectric structure 106 comprises depositing the first ferroelectric structure 106 on the first seed layer 302. The first ferroelectric structure 106 may be deposited by, for example, ALD, PVD, CVD, some other deposition process, or a combination of the foregoing. It will be appreciated that, in some embodiments, the first ferroelectric structure 106 is as described in the aforementioned figures.

In some embodiments, the first ferroelectric structure 106 is deposited by using one or more precursors (e.g., solid precursors). The one or more precursors for depositing the first ferroelectric structure 106 may be or comprise, for example, hafnium chloride ($HfCl_4$), bis(methyl-η5-cyclopentadienyl)dimethylhafnium ($Hf[C_5H_4(CH_3)]_2(CH_3)_2$), bis (methyl-η5-cyclopentadienyl) methoxymethylhafnium ($HfCH_3(OCH_3)[(C_2H_5(CH_3)]_2$), tetrakis(dimethylamido) hafnium(IV) ($Hf(N(CH_3)_2)_4$), tetrakis(ethylmethylamido) hafnium(IV) ($Hf(N(CH_3(C_2H_5))_4$), zirconium chloride ($ZrCl_4$), zirconium(IV) tert-butoxide ($Zr[OC(CH_3)_{3]4}$), bis (methyl-η5-cyclo-pentadienyl) methoxymethylzirconium ($Zr(CH_3C_5H_4)_2CH_3OCH_3$), tetrakis(dimethylamido)zirconium(IV) ($Zr(N(CH_3)_2)_4$), tetrakis(ethylmethylamido)zirconium(IV) ($Zr(N(CH_3(C_2H_5))_4$), some other suitable precursor, or a combination of the foregoing.

Figure 16:
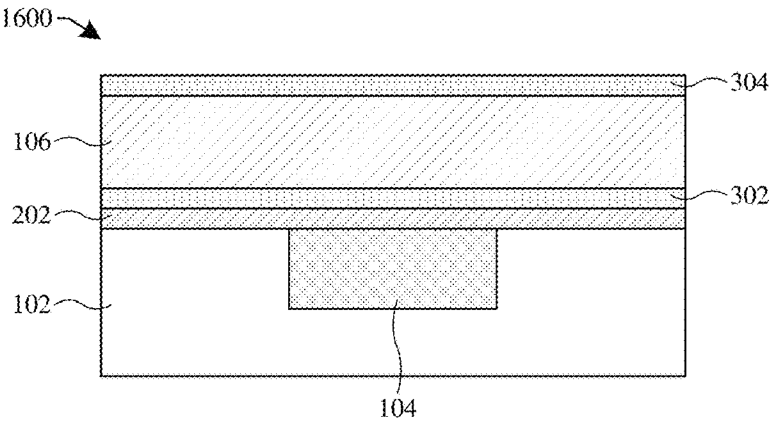

As shown in cross-sectional view 1600 of FIG. 16, a second seed layer 304 is formed over the first ferroelectric structure 106. In some embodiments, formation of the second seed layer 304 is omitted. The second seed layer 304 may be formed in a substantially similar manner as the first seed layer 302. It will be appreciated that, in some embodiments, the second seed layer 304 is as described in the aforementioned figures.

Figure 17:
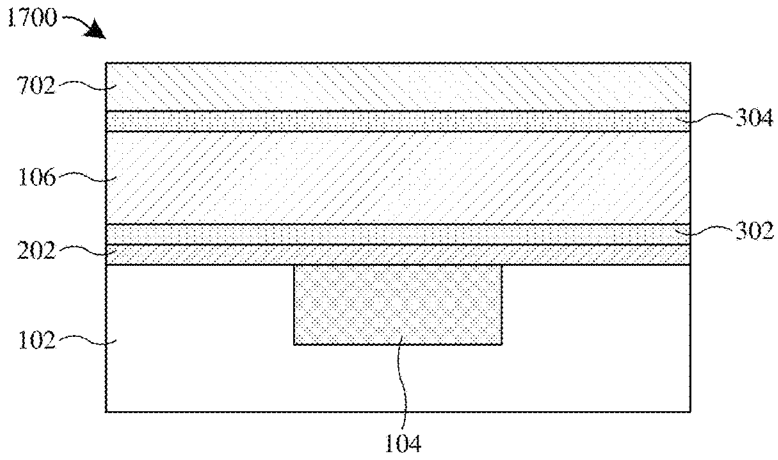

As shown in cross-sectional view 1700 of FIG. 17, a first floating electrode structure 702 is formed over the second seed layer 304. In some embodiments, a process for forming the first floating electrode structure 702 comprises depositing the first floating electrode structure 702 on the second seed layer 304. The first floating electrode structure 702 may be deposited by, for example, ALD, PVD, CVD, sputtering, electrochemical plating, electroless plating, some other deposition process, or a combination of the foregoing. It will be appreciated that, in some embodiments, the first floating electrode structure 702 is as described in the aforementioned figures.

Figure 18:
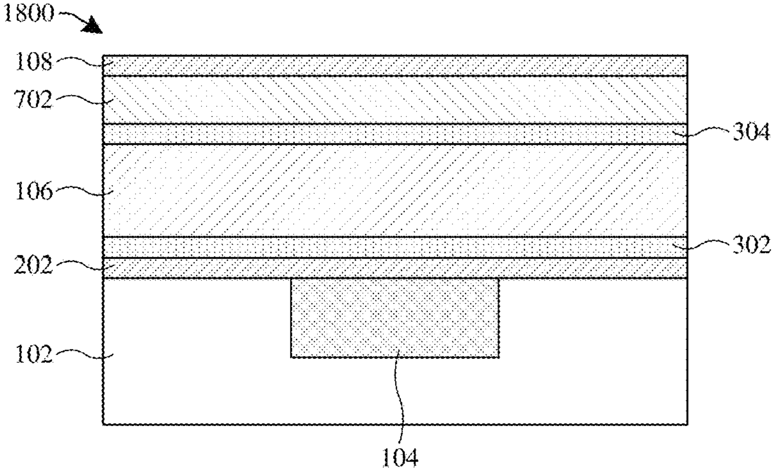

As shown in cross-sectional view 1800 of FIG. 18, a first blocking structure 108 is formed over the first floating electrode structure 702. In some embodiments, a process for forming the first blocking structure 108 comprises depositing or growing the first blocking structure 108 on the first floating electrode structure 702. The first blocking structure 108 may be deposited or grown by, for example, ALD, PVD, CVD, thermal oxidation, some other deposition process, or a combination of the foregoing. It will be appreciated that, in some embodiments, the first blocking structure 108 is as described in the aforementioned figures.

Figure 19:
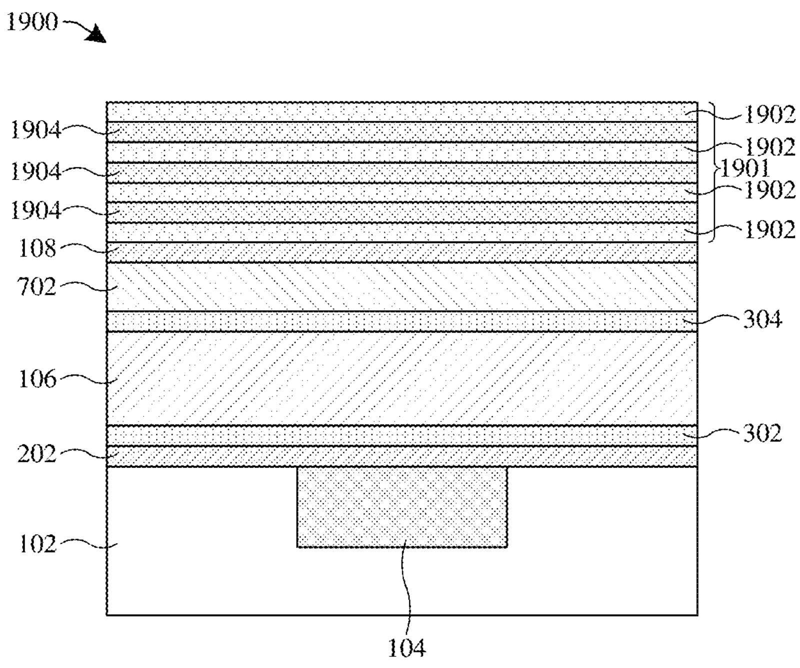

As shown in cross-sectional view 1900 of FIG. 19, a stack of layers 1901 is formed over the first blocking structure 108. The stack of layers 1901 comprises a plurality of individual channel layers 1902 and a plurality of insulator layers 1904. The plurality of individual channel layers 1902 and the plurality of insulator layers 1904 are vertically alternately stacked. For example, a first individual channel layer of the plurality of individual channel layers 1902 is disposed over the first blocking structure 108, a first insulator layer of the plurality of insulator layers 1904 is disposed over the first individual channel layer, a second individual channel layer of the plurality of individual channel layers 1902 is disposed over the first insulator layer, a second insulator layer of the plurality of insulator layers 1904 is disposed over the second individual channel layer, and so forth. Each individual channel layer of the plurality of individual channel layers 1902 is vertically separated from a neighboring individual channel layer by a corresponding one of the plurality of insulator layers 1904. The plurality of insulator layers 1904 electrically isolate the plurality of individual channel layers 1902 from one another.

The plurality of individual channel layers 1902 are or comprise a semiconductor material. In some embodiments, the plurality of individual channel layers 1902 are or comprise, for example, indium gallium zinc oxide (IGZO); amorphous indium gallium zinc oxide (a-IGZO); silicon (Si); silicon-germanium (SiGe); a group III-V semiconductor; gallium arsenide (GaAs); gallium arsenide indium (GaAsIn); a group II-VI semiconductor; zinc oxide (ZnO); magnesium oxide (MgO); gadolinium oxide (GdO); gallium oxide (GaO); indium oxide (InO); a compound semiconductor; amorphous silicon (a-Si); polycrystalline silicon; or some other suitable material. In some embodiments, the plurality of individual channel layers 1902 are formed with thicknesses between about 0.1 nm and about 100 nm.

The plurality of insulator layers 1904 are or comprise, for example, aluminum oxide ($Al_2O_3$), silicon oxide ($SiO_2$), magnesium oxide (MgO), calcium oxide (CaO), yttrium oxide ($Y_2O_3$), zirconium oxide ($ZrO_2$), hafnium oxide ($HfO_2$), zirconium silicon oxide ($ZrSiO_4$), hafnium silicon oxide ($HfSiO_4$), or the like. In some embodiments, the plurality of insulator layers 1904 may be doped with silicon (Si), magnesium (Mg), aluminum (Al), lanthanum (La), strontium (Sr), gadolinium (Gd), nitrogen (N), scandium (Sc), calcium (Ca), or the like. In some embodiments, the plurality of insulator layers 1904 may be a compound comprising silicon (Si), magnesium (Mg), aluminum (Al), lanthanum (La), strontium (Sr), gadolinium (Gd), nitrogen (N), scandium (Sc), calcium (Ca), or the like. In some embodiments, the plurality of insulator layers 1904 are formed with thicknesses between about 0.1 nm and about 20 nm.

In some embodiments, a process for forming the stack of layers 1901 comprises depositing the plurality of individual channel layers 1902 and the plurality of insulator layers 1904 in an alternating manner. For example, the first individual channel layer of the plurality of individual channel layers 1902 is deposited on the first blocking structure 108, the first insulator layer of the plurality of insulator layers 1904 is then deposited on the first individual channel layer, the second individual channel layer of the plurality of individual channel layers 1902 is then deposited on the first insulator layer, the second insulator layer of the plurality of insulator layers 1904 is then deposited on the second individual channel layer, and so forth. The plurality of individual channel layers 1902 and the plurality of insulator layers 1904 may be deposited by, for example, ALD, CVD, PVD, some other deposition process, or a combination of the foregoing.

In some embodiments, the plurality of individual channel layers 1902 and the plurality of insulator layers 1904 are deposited by using one or more precursors (e.g., solid precursors). The one or more precursors for depositing the plurality of individual channel layers 1902 may be or comprise, for example, trimethyl-indium (TMIn), triethyl-indium (TEIn), Cyclopentadienylindium ($C_5H_5In$), Bis(trimethylsilyl)amine)dimethylindium ($C_8H_{24}InNSi_2$), Dimethylaminopropylindiumdimethyl ($C_7H_{18}InN$), Triethylgallium, ($Ga(C_2H_5)_3$), gallium trimethylamine (Ga $(NMe)_3$), gallium acetylacetonate (Ga(acac)3), gallium monoiodide (GaCp*), trimethylgallium (TMGa), tris(dimethylamido)gallium(III) ($Ga_2(NMe_2)_6$), zinc acetate (Zn $(CH_3CO_2)_2$), dimethylzinc ($Zn(CH_3)_2$), Diethylzinc ($(C_2H_5)_2Zn$), methylzinc isopropoxide ($(CH_3)Zn(OCH(CH_3)_2)$]), some other suitable precursor, or a combination of the foregoing. The one or more precursors for depositing the plurality of insulator layers 1904 may be or comprise, for example, (3-Aminopropyl)triethoxysilane ($H_2N(CH_2)_3Si(OC_2H_5)_3$), N-sec-butyl(trimethylsilyl)amine ($C_7H_{19}NSi$), chloropentamethyldisilane ($(CH_3)_3SiSi(CH_3)_2Cl$), 1,2-dichlorotetramethyldisilane ($[ClSi(CH_3)_2]_2$), 1,3-diethyl-1,1,3,3-tetramethyldisilazane ($C_8H_{23}NSi_2$), dodecamethylcyclohexasilane ($(Si(CH_3)_2)_6$), hexamethyldisilane ($(Si(CH_3)_3)_2$), hexamethyldisilazane ($(CH_3)_3SiNHSi(CH_3)_3$), 2,4,6,8,10-pentamethylcyclopentasiloxane ($(CH_3SiHO)_5$), pentamethyldisilane ($(CH_3)_3SiSi(CH_3)_2H$), silicon tetrabromide ($SiBr_4$), silicon tetrachloride ($SiCl_4$), tetraethylsilane ($Si(C_2H_5)_4$), 2,4,6,8-tetramethylcyclotetrasiloxane ($(HSiCH_3O)_4$), 1,1,2,2-tetramethyldisilane ($(CH_3)_2SiHSiH(CH_3)_2$), tetramethylsilane ($Si(CH_3)_4$), N,N',N"-tri-tert-butylsilanetriamine ($HSi(HNC(CH_3)_3)_3$), tris(tert-butoxy)silanol ($((CH_3)_3CO)_3SiOH$), tris(tert-pentoxy)silanol ($(CH_3CH_2C(CH_3)_2O)_3SiOH$), aluminum tris(2,2,6,6-tetramethyl-3,5-heptanedionate) ($Al(OCC(CH_3)_3CHCOC(CH_3)_3)_3$), triisobutylaluminum ($[(CH_3)_2CHCH_2]_3Al$), trimethylaluminum ($(CH_3)_3Al$), tris(dimethylamido)aluminum (III) ($Al(N(CH_3)_2)_3$), some other suitable precursor, or a combination of the foregoing.

While the cross-sectional view 1900 of FIG. 19 illustrates the plurality of individual channel layers 1902 comprising 4 individual channel layers, it will be appreciated that the plurality of individual channel layers 1902 may comprise some other number of individual channel structures (e.g., M channel layers, where M is any number greater than 2). Likewise, while the cross-sectional view 1900 of FIG. 19 illustrates the plurality of insulator layers 1904 comprising 3 insulator layers, it will be appreciated that the plurality of insulator layers 1904 may comprise some other number of insulator structures (e.g., M−1 insulator layers).

Figure 20:
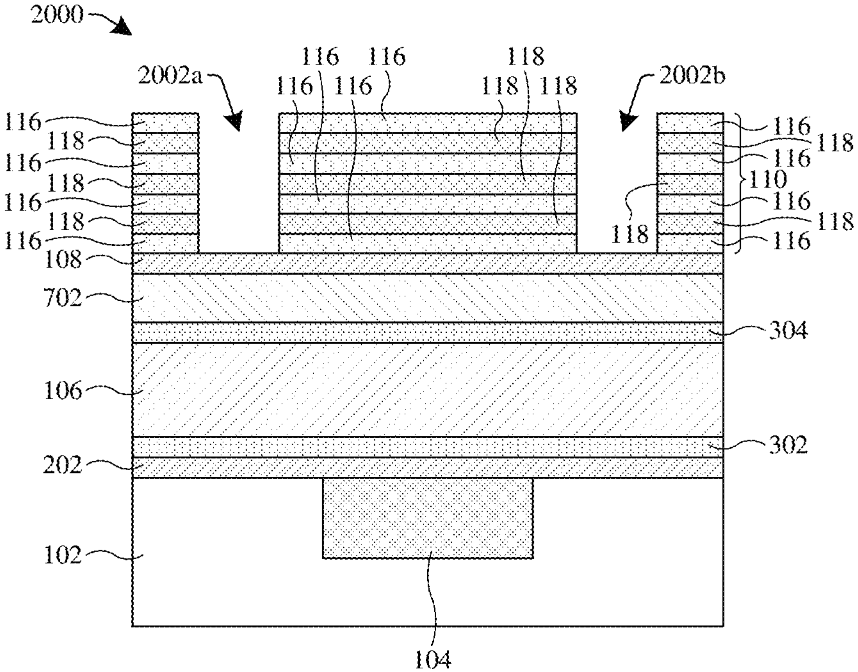

As shown in cross-sectional view 2000 of FIG. 20, a first pair of openings 2002 are formed in the stack of layers 1901 (see, FIG. 19). For example, a first opening **2002*a* and a second opening 2002*b* are formed in the stack of layers 1901. In some embodiments, the first pair of openings 2002 are formed extending vertically through the plurality of individual channel layers 1902 and the plurality of insulator layers 1904. In further embodiments, the first pair of openings 2002 expose corresponding portions of the first blocking structure 108. For example, the first opening 2002*a* exposes a first portion of the first blocking structure 108, and the second opening 2002*b* exposes a second portion of the first blocking structure 108 laterally spaced from the first portion of the first blocking structure 108. The first pair of openings 2002 is formed so that the first electrode structure 104 is disposed laterally between the first opening 2002*a* and the second opening 2002*b*. By forming the first pair of openings 2002, a channel structure 110, a plurality of individual channel structures 116, and a plurality of insulator structures 118 are formed over the first blocking structure 108**.

In some embodiments, a process for forming the first pair of openings 2002 comprises forming a patterned masking layer (not shown) (e.g., positive/negative photoresist, a hardmask, etc.) over the stack of layers 1901 (see, FIG. 19). The patterned masking layer may be formed by forming a masking layer (not shown) on the stack of layers 1901 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the stack of layers 1901 according to the patterned masking layer.

The etching process removes unmasked portions of the stack of layers 1901, thereby forming the first pair of openings 2002 and the channel structure 110. More specifically, the etching process removes unmasked portions of the plurality of individual channel layers 1902, thereby forming the plurality of individual channel structures 116; and the etching process removes unmasked portions of the plurality of insulator layers 1904, thereby forming the plurality of insulator structures 118. In some embodiments, the etching process may be or comprise, for example, a wet etching process, a dry etching process, a reactive ion etching (RIE) process, some other etching process, or a combination of the foregoing. Subsequently, the patterned masking layer may be stripped away. It will be appreciated that, in some embodiments, the channel structure 110, the plurality of individual channel structures 116, and the plurality of insulator structures 118 are as described in the aforementioned figures.

Figure 21:
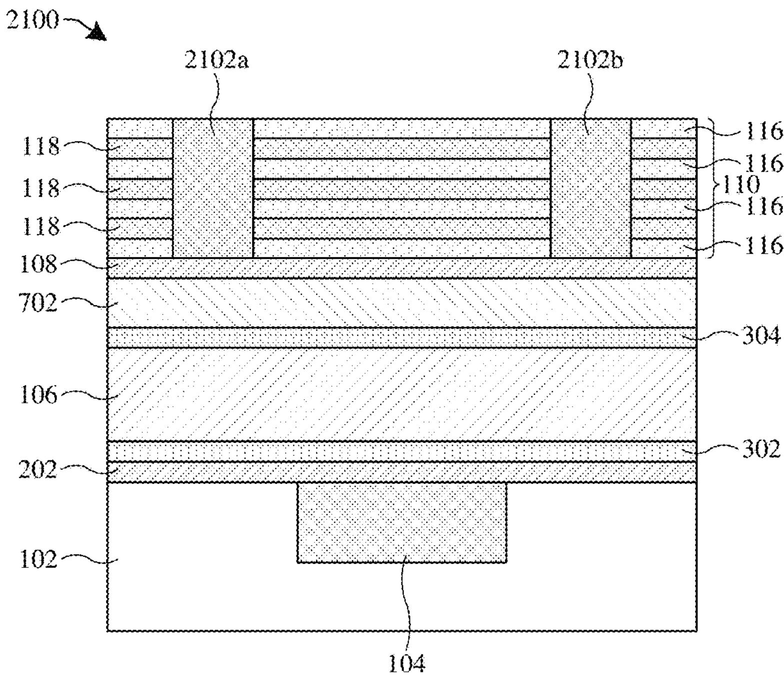

As shown in cross-sectional view 2100 of FIG. 21, a pair of conductive structures 2102 are formed in the first pair of openings 2002 (see, FIG. 20). For example, a sixth conductive structure **2102*a* is formed in the first opening 2002*a*, and a seventh conductive structure 2102*b* is formed in the second opening 2002*b* (see, FIG. 20). The pair of conductive structures 2102 are formed electrically coupled to the plurality of individual channel structures 116. The pair of conductive structures 2102** may be or comprise, for example, aluminum (Al) titanium (Ti), tantalum (Ta), tungsten (W), gold (Au), ruthenium (Ru), some other conductive material, or a combination of the foregoing.

In some embodiments, a process for forming the pair of conductive structures 2102 comprises depositing a conductive layer (not shown) over the channel structure 110 and in the first pair of openings 2002. The conductive layer may be deposited by, for example, ALD, PVD, CVD, sputtering, electrochemical plating, electroless plating, some other deposition process, or a combination of the foregoing. Thereafter, a planarization process (e.g., a chemical mechanical polishing (CMP) process, an etch back process, etc.) is performed on the conductive layer, thereby forming the pair of conductive structures 2102. The conductive layer may be or comprise, for example, aluminum (Al) titanium (Ti), tantalum (Ta), tungsten (W), gold (Au), ruthenium (Ru), some other conductive material, or a combination of the foregoing.

Figure 22:
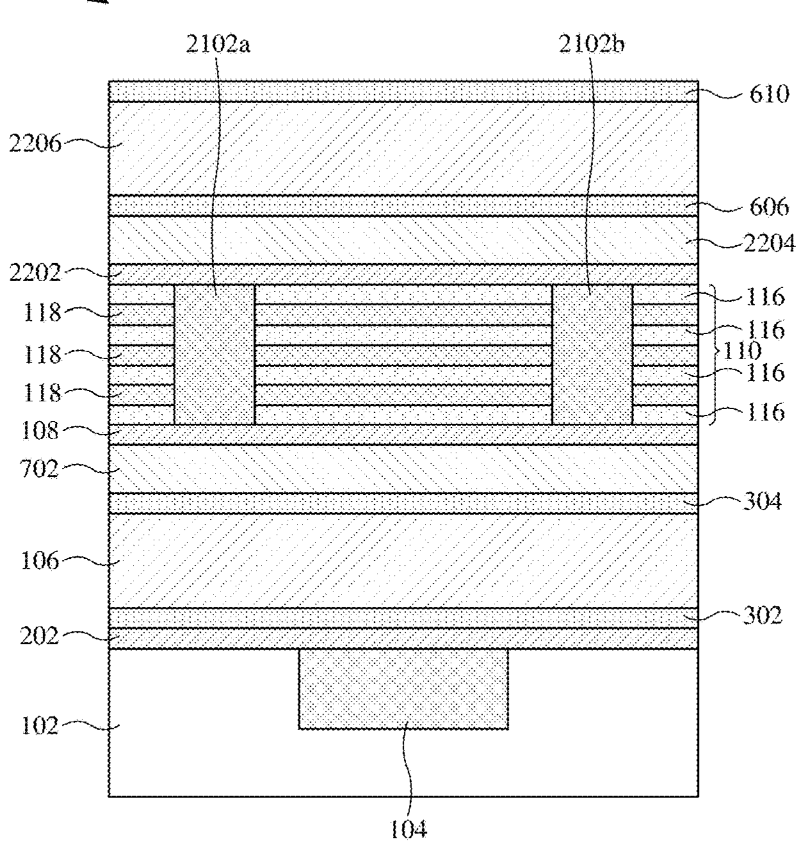

As shown in cross-sectional view 2200 of FIG. 22, a blocking layer 2202 is formed over the channel structure 110 and the pair of conductive structures 2102. The blocking layer 2202 may be or comprise, for example, hafnium oxide ($HfO_2$), silicon doped hafnium oxide (HSO), hafnium zirconium oxide (HfZrO), silicon oxide ($SiO_2$), aluminum oxide ($Al_2O_3$), yttrium oxide ($Y_2O_3$), zirconium oxide ($ZrO_2$), magnesium oxide (MgO), or the like. In some embodiments, the blocking layer 2202 may comprise silicon (Si), magnesium (MG), aluminum (Al), yttrium (Y), yttrium oxide ($Y_2O_3$), lanthanum (La), strontium (Sr), gadolinium (Gd), nitrogen (N), scandium (Sc), calcium (Ca), or the like. In some embodiments, the blocking layer 2202 is formed with a thickness between about 0.1 nm and about 10 nm. In some embodiments, the blocking layer 2202 is silicon doped hafnium oxide (HSO) and comprises at least 10% silicon atoms. In some embodiments, the blocking layer 2202 comprises a silicon doped hafnium oxide (HSO) layer and a hafnium zirconium oxide (HfZrO) layer. In such embodiments, the hafnium zirconium oxide (HfZrO) layer may be formed with a thickness of about 1 nm Also shown in the cross-sectional view 2200 of FIG. 22, a floating electrode layer 2204 is formed over the blocking layer 2202. In some embodiments, a process for forming the floating electrode layer 2204 comprises depositing the floating electrode layer 2204 on the blocking layer 2202. The floating electrode layer 2204 may be deposited by, for example, ALD, PVD, CVD, sputtering, electrochemical plating, electroless plating, some other deposition process, or a combination of the foregoing. The floating electrode layer 2204 may be or comprise, for example, titanium (Ti), titanium nitride (TiN), tungsten (W), tungsten nitride (WN), tantalum (Ta), tantalum nitride (TaN), platinum (Pt), gold (Au), or the like. In some embodiments, the floating electrode layer 2204 is formed with a thickness between about 1 nm and about 50 nm.

Also shown in the cross-sectional view 2200 of FIG. 22, a third seed layer 606 is formed over the floating electrode layer 2204. In some embodiments, formation of the third seed layer 606 is omitted. The third seed layer 606 may be formed in a substantially similar manner as the first seed layer 302.

Also shown in the cross-sectional view 2200 of FIG. 22, a ferroelectric layer 2206 is formed over the third seed layer 606. In some embodiments, a process for forming the ferroelectric layer 2206 comprises depositing the ferroelectric layer 2206 on the third seed layer 606. The ferroelectric layer 2206 may be deposited by, for example, ALD, PVD, CVD, some other deposition process, or a combination of the foregoing.

The ferroelectric layer 2206 may be or comprise, for example, hafnium zirconium oxide (HfZrO), scandium-doped aluminum nitride (AlScN), some other ferroelectric material, or a combination of the foregoing. In some embodiments, the ferroelectric layer 2206 is hafnium zirconium oxide (HfZrO). The ferroelectric layer 2206 may be hafnium zirconium oxide (HfZrO) and comprise oxygen vacancies. In some embodiments, the ferroelectric layer 2206 is hafnium zirconium oxide (HfZrO) that is doped with aluminum (Al), silicon (Si), lanthanum (La), scandium (Sc), calcium (Ca), barium (Ba), gadolinium (Gd), yttrium (Y), strontium (Sr), or the like. In some embodiments, the ferroelectric layer 2206 may be formed with a thickness between about 0.1 nm and about 100 nm.

In some embodiments, the ferroelectric layer 2206 is hafnium zirconium oxide ($Hf_xZr_{1-x}O_y$), where X is between 0 and 1. In further embodiments, the ferroelectric layer 2206 is hafnium zirconium oxide ($Hf_{0.5}Zr_{0.5}O_2$). In yet further embodiments, the ferroelectric layer 2206 may be formed with four different crystal phases: an orthorhombic phase (o-phase), a monoclinic phase (m-phase), a tetragonal phase (t-phase), and a cubic phase (cubic-phase). In yet further embodiments, the monoclinic phase may be less than fifth percent (50%) of a combination of the four crystal phases of the ferroelectric layer 2206.

In some embodiments, the ferroelectric layer 2206 is deposited by using one or more precursors (e.g., solid precursors). The one or more precursors for depositing the ferroelectric layer 2206 may be or comprise, for example, hafnium chloride ($HfCl_4$), bis(methyl-η5-cyclopentadienyl) dimethylhafnium ($Hf[C_5H_4(CH_3)]_2(CH_3)_2$), bis(methyl-η5-cyclopentadienyl) methoxymethylhafnium ($HfCH_3(OCH_3)[(C_2H_5(CH_3)]_2$), tetrakis(dimethylamido)hafnium(IV) ($Hf(N(CH_3)_2)_4$), tetrakis(ethylmethylamido)hafnium(IV) ($Hf(N(CH_3(C_2H_5))_4$), zirconium chloride ($ZrCl_4$), zirconium(IV) tert-butoxide ($Zr[OC(CH_3)_3]_4$), bis(methyl-η5-cyclo-pentadienyl) methoxymethylzirconium ($Zr(CH_3C_5H_4)_2CH_3OCH_3$), tetrakis(dimethylamido)zirconium(IV) ($Zr(N(CH_3)_2)_4$), tetrakis(ethylmethylamido)zirconium(IV) ($Zr(N(CH_3(C_2H_5))_4$), some other suitable precursor, or a combination of the foregoing.

Also shown in the cross-sectional view 2200 of FIG. 22, a fourth seed layer 610 is formed over the ferroelectric layer 2206. In some embodiments, formation of the fourth seed layer 610 is omitted. The fourth seed layer 610 may be formed in a substantially similar manner as the first seed layer 302.

Figure 23:
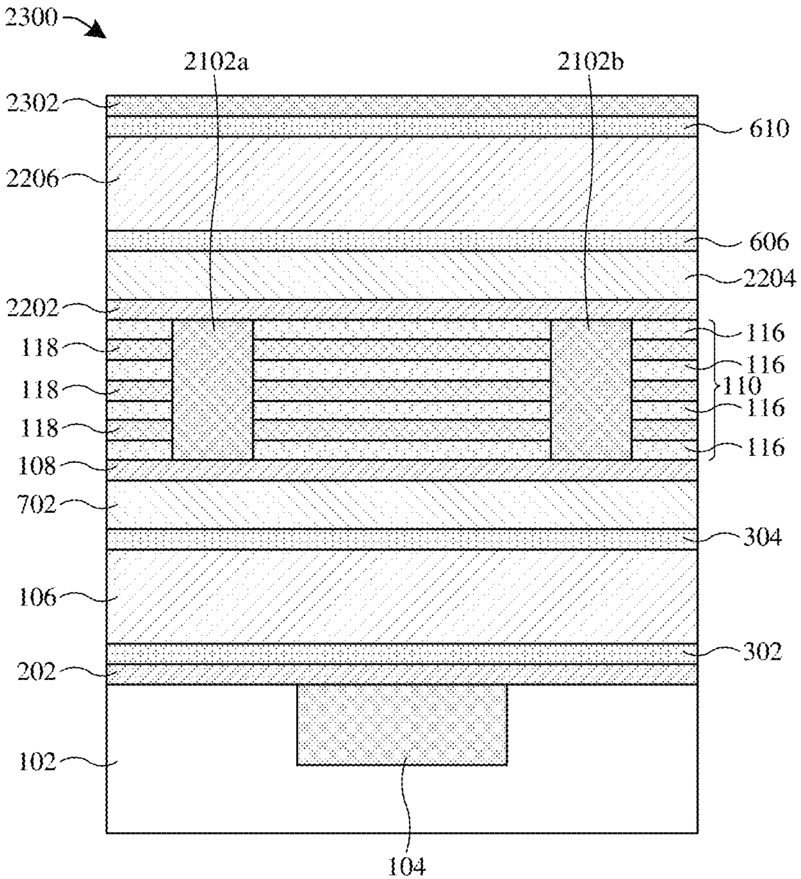

As shown in cross-sectional view 2300 of FIG. 23, a metal layer 2302 is formed over the ferroelectric layer 2206. In some embodiments, the metal layer 2302 is formed over the fourth seed layer 610. The metal layer 2302 may be or comprise, for example, copper (Cu), aluminum (Al), platinum (Pt), titanium (Ti), tantalum (Ta), tungsten (W), gold (Au), some other metal material, or a combination of the foregoing. In some embodiments, a process for forming the metal layer 2302 comprises depositing the metal layer 2302 on the fourth seed layer 610. The metal layer 2302 may be deposited by, for example, ALD, PVD, CVD, sputtering, electrochemical plating, electroless plating, some other deposition process, or a combination of the foregoing.

Figure 24:
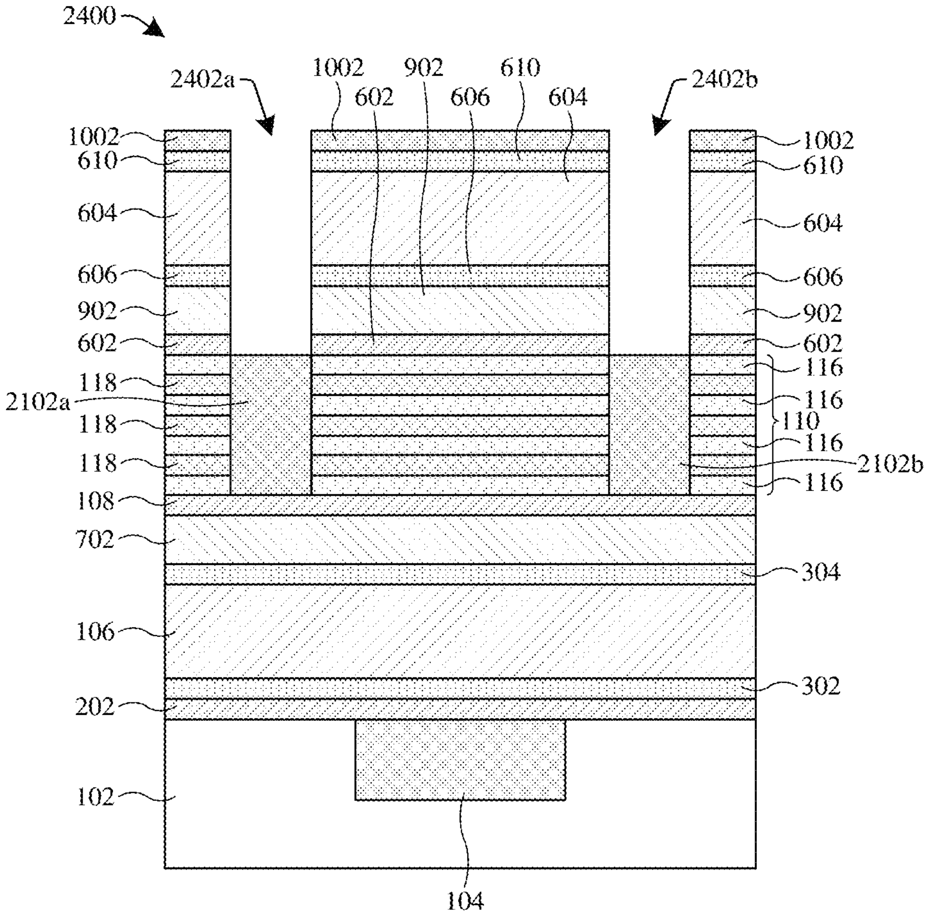

As shown in cross-sectional view 2400 of FIG. 24, a second pair of openings 2402 are formed in the structure illustrated in the cross-sectional view 2300 of FIG. 23. For example, a third opening 2402*a* and a fourth opening 2402*b* are formed in the structure illustrated in the cross-sectional view 2300 of FIG. 23. The second pair of openings 2402 are formed over the pair of conductive structures 2102.

The second pair of openings 2402 are formed extending vertically through the metal layer 2302, the fourth seed layer 610, the ferroelectric layer 2206, the third seed layer 606, the floating electrode layer 2204, and the blocking layer 2202 (see, FIG. 23). The third opening 2402*a* exposes the sixth conductive structure 2102*a*. The fourth opening 2402*b* exposes the seventh conductive structure 2102*b*. By forming the second pair of openings 2402, a second blocking structure 602 is formed over the channel structure 110, a second floating electrode structure 902 is formed over the second blocking structure 602, a second ferroelectric structure 604 is formed over the second floating electrode structure 902, and a metal structure 1002 is formed over the second ferroelectric structure 604.

In some embodiments, a process for forming the second pair of openings 2402 comprises forming a patterned masking layer (not shown) (e.g., positive/negative photoresist, a hardmask, etc.) over the metal layer 2302. The patterned masking layer may be formed by forming a masking layer (not shown) on the metal layer 2302 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the metal layer 2302, the fourth seed layer 610, the ferroelectric layer 2206, the third seed layer 606, the floating electrode layer 2204, and the blocking layer 2202 according to the patterned masking layer.

The etching process removes unmasked portions of the metal layer 2302, thereby forming the metal structure 1002. The etching process also removes unmasked portions of the ferroelectric layer 2206, thereby forming the second ferroelectric structure 604. The etching process also removes unmasked portions of the floating electrode layer 2204, thereby forming the second floating electrode structure 902. The etching process also removes unmasked portions of the blocking layer 2202, thereby forming the second blocking structure 602. The etching process also removes unmasked portions of the third seed layer 606 and the fourth seed layer 610.

By removing the unmasked portions of the metal layer 2302, the fourth seed layer 610, the ferroelectric layer 2206, the third seed layer 606, the floating electrode layer 2204, and the blocking layer 2202, the second pair of openings 2402 are formed. In some embodiments, the etching process may be or comprise, for example, a wet etching process, a dry etching process, a RIE process, some other etching process, or a combination of the foregoing. Subsequently, the patterned masking layer may be stripped away. It will be appreciated that, in some embodiments, the second blocking structure 602, the second floating electrode structure 902, the third seed layer 606, the second ferroelectric structure 604, the fourth seed layer 610, and the metal structure 1002 are as described in the aforementioned figures.

Figure 25:
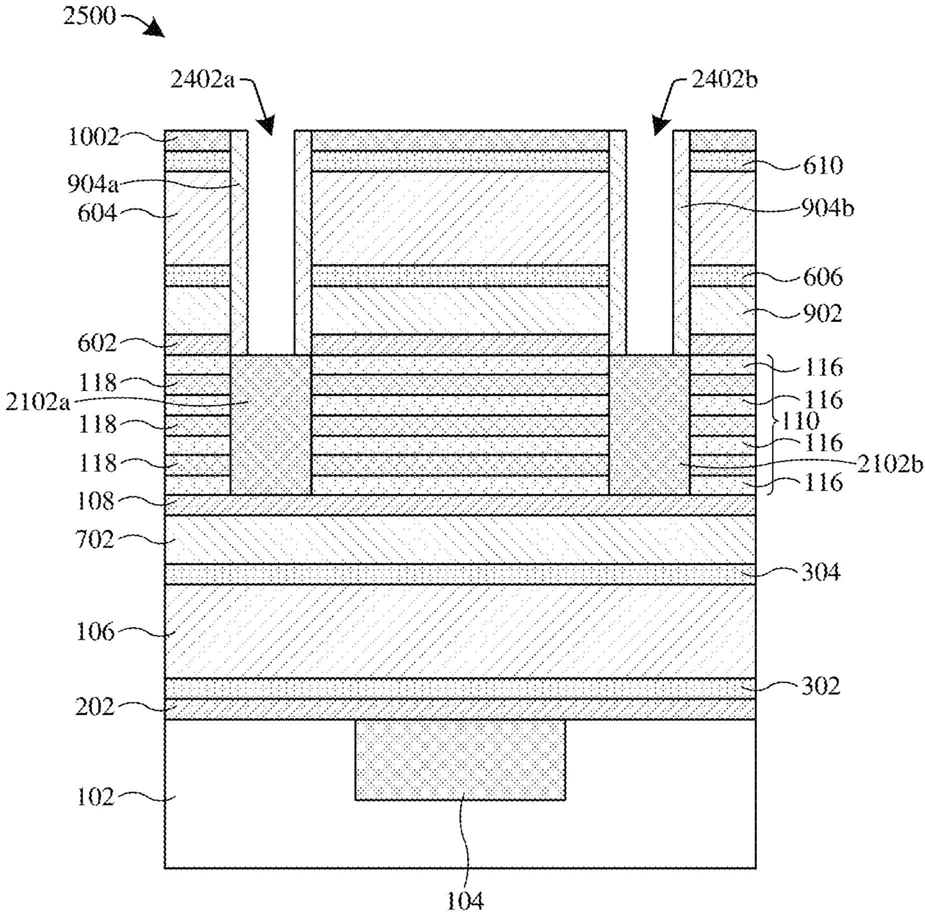

As shown in cross-sectional view 2500 of FIG. 25, a plurality of spacer structures 904 are formed in the second pair of openings 2402 and over the pair of conductive structures 2102. For example, a first spacer structure **904*a* is formed in the third opening 2402*a* and over the sixth conductive structure 2102*a*, and a second spacer structure 904*b* is formed in the fourth opening 2402*b* and over the seventh conductive structure 2102*b*. In some embodiments, the plurality of spacer structures 904 are formed on (e.g., directly on) the pair of conductive structures 2102. The plurality of spacer structures 904 are formed lining sidewalls of the second pair of openings 2402. In some embodiments, the spacer structures 904 are formed lining opposite sidewalls of the second pair of openings 2402, as shown in the cross-sectional view 2500 of FIG. 25. In other embodiments, the spacer structures 904 may be formed lining only a single sidewall of the opposite sidewalls of the second pair of openings 2402 (see, e.g., FIG. 10**).

In some embodiments, a process for forming the plurality of spacer structures 904 comprises depositing a spacer layer (not shown) over the metal structure 1002 and in (e.g., along sides) of the second pair of openings 2402. The spacer layer may be deposited by, for example, CVD, PVD, ALD, some other deposition process, or a combination of the foregoing. Thereafter, horizontal portions of the spacer layer are etched away (e.g., via an anisotropic etching process), thereby leaving vertical portions of the spacer layer in place as the plurality of spacer structures 904. In embodiments in which the spacer structures 904 are formed lining only the single sidewall of the opposite sidewalls of the second pair of openings 2402, a patterned masking layer may be formed before the spacer layer is etched (e.g., to protect the portion of the spacer layer along the single sidewall of the opposite sidewalls). In some embodiments, the spacer layer may be or comprise, for example, an oxide (e.g., $SiO_2$), a nitride (e.g., SiN), an oxy-nitride (e.g., SiON), some other dielectric material, or a combination of the foregoing. It will be appreciated that, in some embodiments, the plurality of spacer structures 904 are as described in the aforementioned figures.

Figure 26:
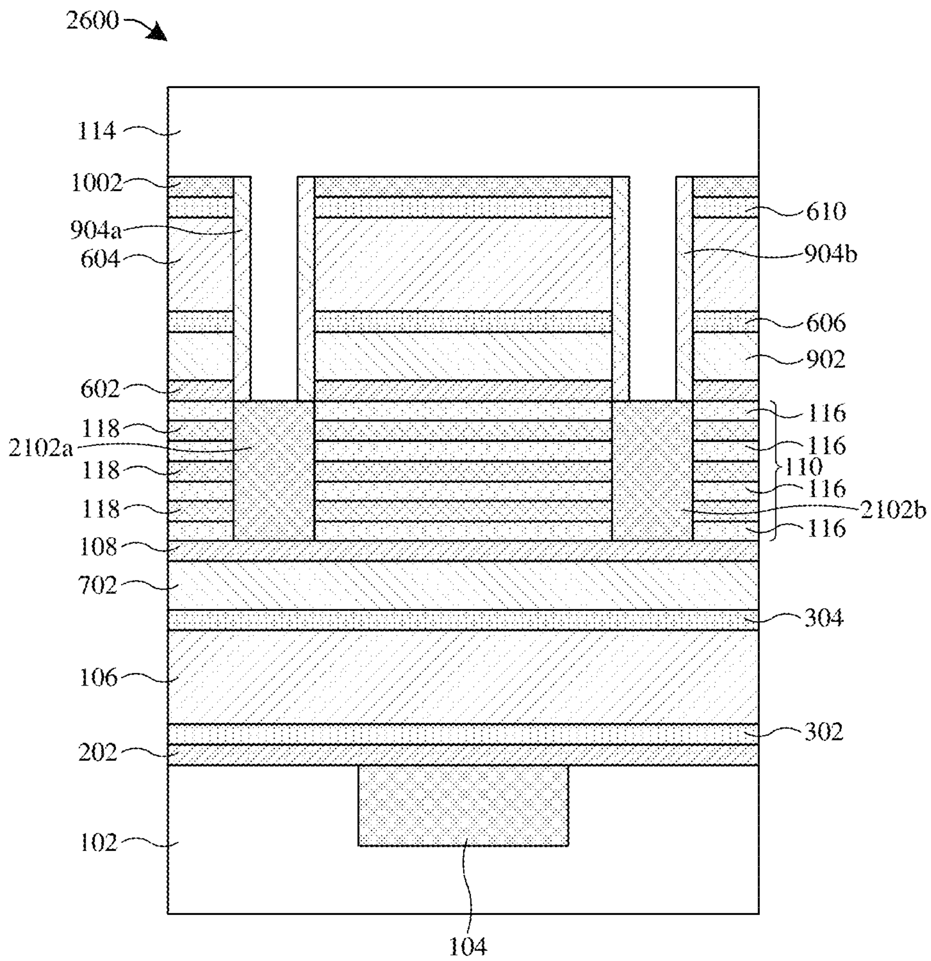

As shown in cross-sectional view 2600 of FIG. 26, a first dielectric layer 114 is formed over the metal structure 1002, over the pair of spacer structures 904, and in the second pair of openings 2402 (see, FIG. 25). The first dielectric layer 114 is formed along inner sidewalls of the plurality of spacer structures 904. In some embodiments, the first dielectric layer 114 is formed in contact with (e.g., in direct contact with) the pair of conductive structures 2102. In some embodiments, the first dielectric layer 114 is formed with a substantially planar upper surface.

In some embodiments, a process for forming the first dielectric layer 114 comprises depositing the first dielectric layer 114 on the metal structure 1002, on the pair of spacer structures 904, and in the second pair of openings 2402 (e.g., in the remaining portions of the second pair of openings 2402 not occupied by the plurality of spacer structures 904). The first dielectric layer 114 may be deposited by, for example, CVD, PVD, ALD, a spin-on process, some other deposition process, or a combination of the foregoing. In some embodiments, a planarization process (e.g., a CMP process, an etch back process, etc.) is performed on the first dielectric layer 114 to planarize the upper surface of the first dielectric layer 114. It will be appreciated that, in some embodiments, the first dielectric layer 114 is as described in the aforementioned figures.

Figure 27:
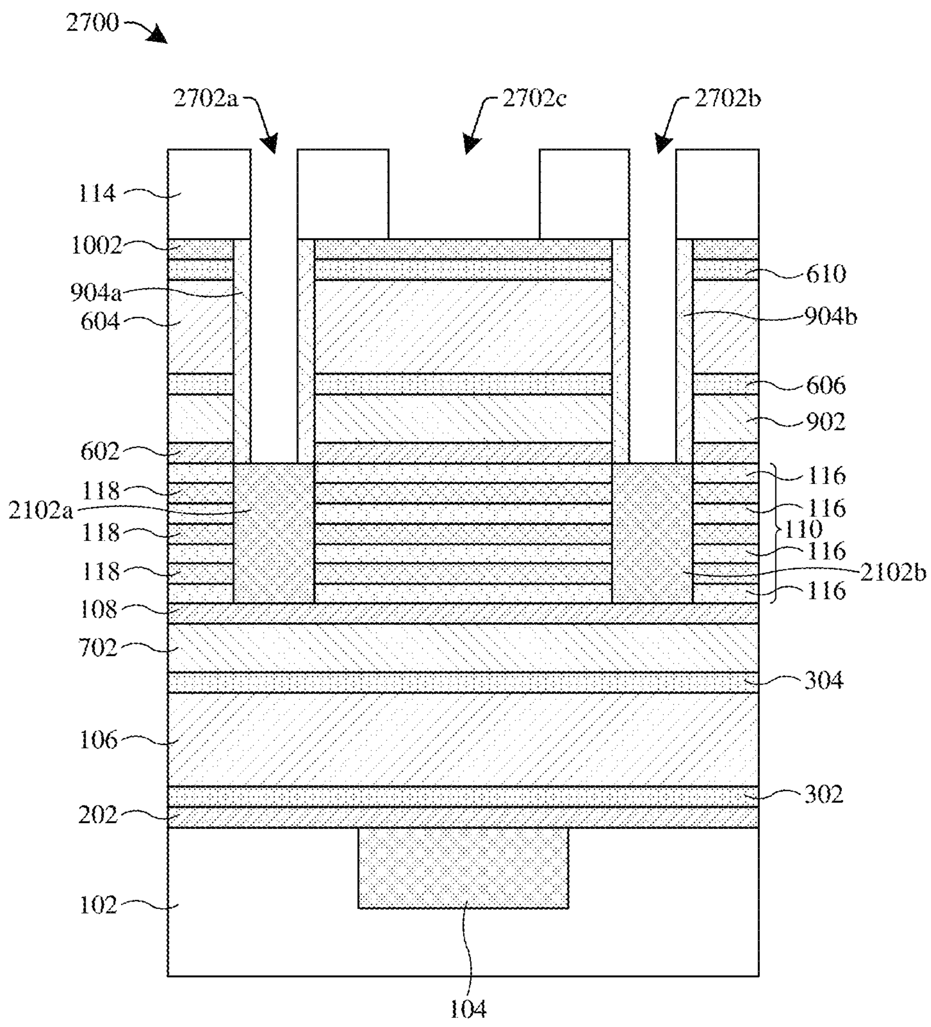

As shown in cross-sectional view 2700 of FIG. 27, a plurality of openings 2702 are formed in the first dielectric layer 114. For example, a fifth opening **2702*a*, a sixth opening 2702*b*, and a seventh opening 2702*c* are formed in the first dielectric layer 114. The fifth opening 2702*a* extends through the first dielectric layer 114 to expose the sixth conductive structure 2102*a*. The sixth opening 2702*b* extends through the first dielectric layer 114 to expose the seventh conductive structure 2102*b*. The seventh opening 2702*c* is disposed laterally between the fifth opening 2702*a* and the sixth opening 2702*b*. The seventh opening 2702*c* is laterally spaced from both the fifth opening 2702*a* and the sixth opening 2702*b*. In some embodiments, the seventh opening 2702*c* exposes the metal structure 1002. In other embodiments, the seventh opening 2702*c* may expose a different structure (e.g., the fourth seed layer 610, the passivation structure 112, or the second ferroelectric structure 604**).

In some embodiments, a process for forming the plurality of openings 2702 comprises forming a patterned masking layer (not shown) (e.g., positive/negative photoresist, a hardmask, etc.) over the first dielectric layer 114. The patterned masking layer may be formed by forming a masking layer (not shown) on the first dielectric layer 114 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on first dielectric layer 114 according to the patterned masking layer. The etching process removes unmasked portions of the first dielectric layer 114, thereby forming the plurality of openings 2702.

Figure 28:
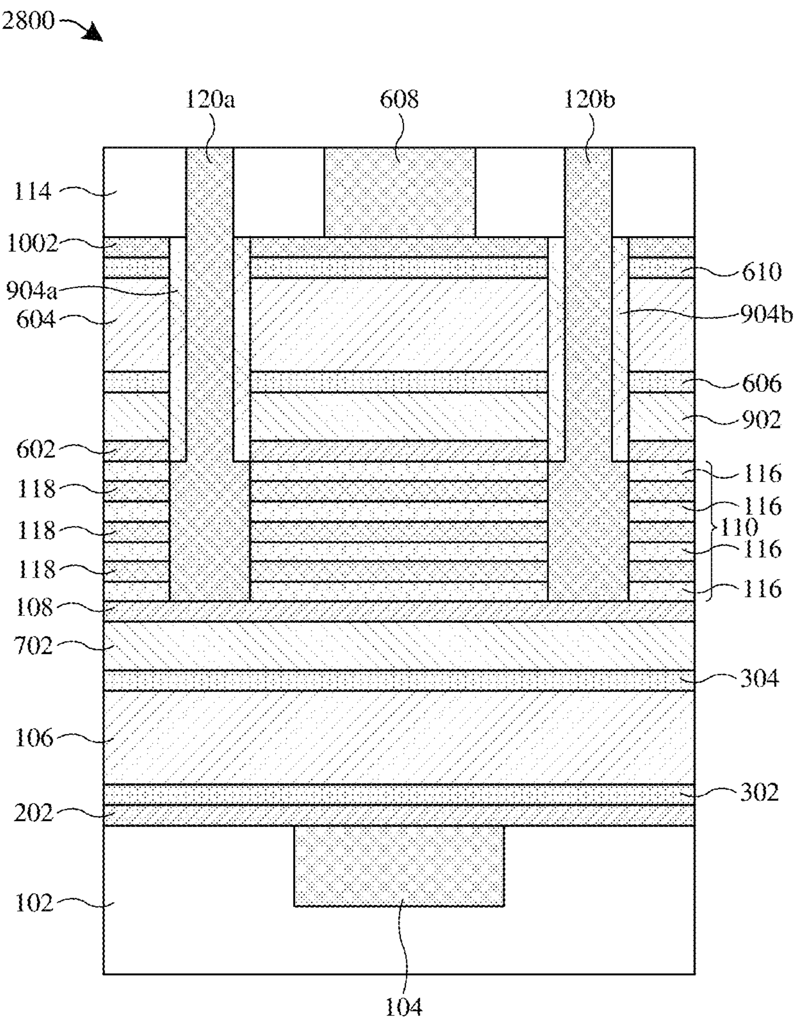

A show in cross-sectional view 2800 of FIG. 28, a pair of S/D structures 120 and a second electrode structure 608 are formed in the first dielectric layer 114 and in the plurality of openings 2702 (see, FIG. 27). More specifically, a first S/D structure 120*a* is formed in the fifth opening 2702*a*, a second S/D structure 120*b* is formed in the sixth opening 2702*b*, and the second electrode structure 608 is formed in the seventh opening 2702*c* (see, FIG. 27). In some embodiments, the first S/D structure 120*a* is also formed between inner sidewalls of the first spacer structure 904*a*. In some embodiments, the second S/D structure 120*b* is also formed between inner sidewalls of the second spacer structure 904*b*. The first S/D structure 120*a* comprises the sixth conductive structure 2102*a* (see, FIG. 27). The second S/D structure 120*b* comprises the seventh conductive structure 2102*b* (see, FIG. 27).

In some embodiments, a process for forming the pair of S/D structures 120 and the second electrode structure 608 comprises depositing a conductive layer (not shown) over the first dielectric layer 114 and in the plurality of openings 2702. It will be appreciated that by depositing the conductive layer in the fifth opening 2702*a* and the sixth opening 2702*b*, the conductive layer is also deposited on the pair of conductive structures 2102. The conductive layer may be deposited by, for example, ALD, PVD, CVD, sputtering, electrochemical plating, electroless plating, some other deposition process, or a combination of the foregoing. Thereafter, a planarization process (e.g., a CMP process, an etch back process, etc.) is performed on the conductive layer, thereby forming the pair of S/D structures 120 and the second electrode structure 608. The conductive layer may be or comprise, for example, aluminum (Al) titanium (Ti), tantalum (Ta), tungsten (W), gold (Au), ruthenium (Ru), some other conductive material, or a combination of the foregoing. It will be appreciated that, in some embodiments, multiple conductive layers and/or multiple masking layers may be utilized to form the pair of S/D structures 120 and the second electrode structure 608 (e.g., a first conductive layer to form the pair of S/D structures 120 and a second, different conductive layer to form the second electrode structure 608). It will also be appreciated that, in some embodiments, the pair of S/D structures 120 and the second electrode structure 608 are as described in the aforementioned figures.

Figure 29:
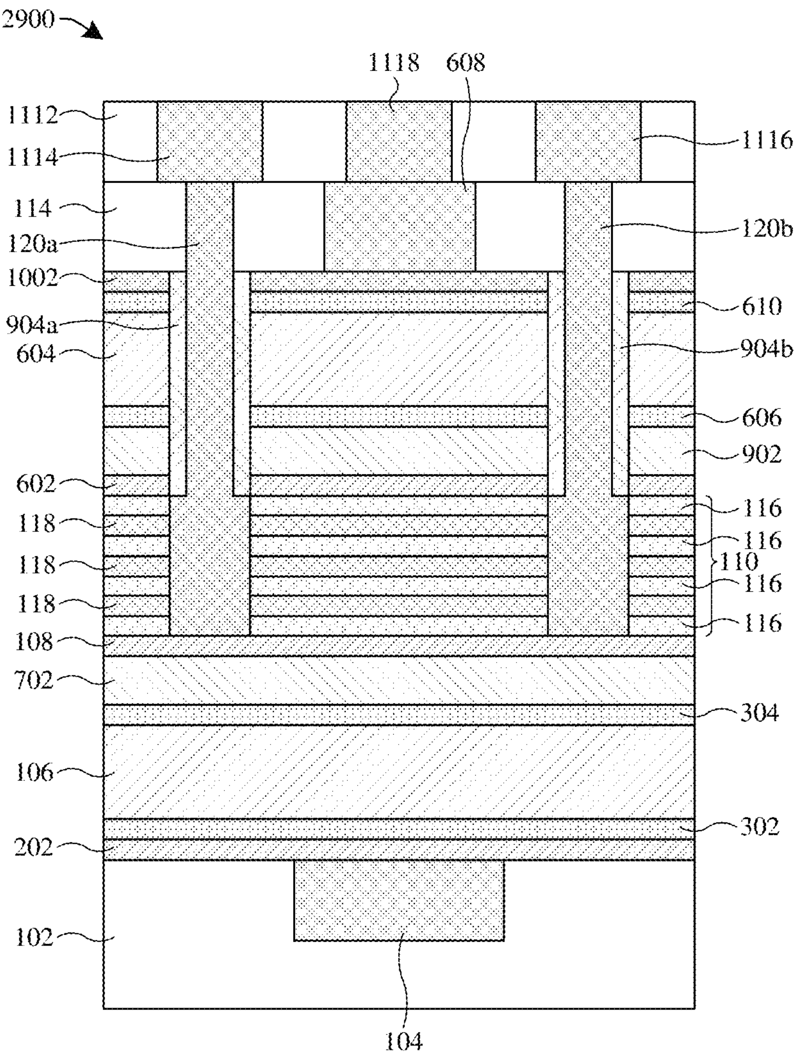

As shown in the cross-sectional view 2900 of FIG. 29, a fourth dielectric layer 1112 is formed over the second electrode structure 608, the pair of S/D structures 120, and the first dielectric layer 114. In some embodiments, a process for forming the fourth dielectric layer 1112 comprises depositing the fourth dielectric layer 1112 on the second electrode structure 608, the pair of S/D structures 120, and the first dielectric layer 114. The fourth dielectric layer 1112 may be deposited by, for example, CVD, PVD, ALD, a spin-on process, some other deposition process, or a combination of the foregoing.

Also shown in the cross-sectional view 2900 of FIG. 29, a third conductive structure 1114, a fourth conductive structure 1116, and a fifth conductive structure 1118 are formed in the fourth dielectric layer 1112. The third conductive structure 1114 is formed electrically coupled to the first S/D structure 120*a*. The fourth conductive structure 1116 is formed electrically coupled to the second S/D structure 120*b*. The fifth conductive structure 1118 is formed electrically coupled to the second electrode structure 608.

In some embodiments, a process for forming the third conductive structure 1114, the fourth conductive structure 1116, and the fifth conductive structure 1118 comprises: forming a plurality of openings in the fourth dielectric layer 1112 (e.g., via a photolithography/etching process); depositing a conductive layer in the plurality of openings and over an upper surface of the fourth dielectric layer 1112; and planarizing the conductive layer to localize the conductive layer to the plurality of openings. Other suitable processes are, however, amenable. The conductive layer may be deposited by, for example, CVD, PVD, ALD, sputtering, electrochemical plating, electroless plating, some other deposition process, or a combination of the foregoing. It will be appreciated that, in some embodiments, the fourth dielectric layer 1112, the third conductive structure 1114, the fourth conductive structure 1116, and the fifth conductive structure 1118 are as described in the aforementioned figures.

Although not shown, it will also be appreciated that additional conductive structure (e.g., metal wires, metal vias, bond pads, etc.) may be formed over and electrically coupled to the third conductive structure 1114, the fourth conductive structure 1116, and the fifth conductive structure 1118. While FIGS. 1-29 illustrate various two-dimensional ferroelectric memory structures (e.g., 2D FeRAM structures), it will be appreciated that the above structures and methods are also applicable to three-dimensional ferroelectric memory structures (e.g., 3D FeRAM structures).

Figure 30:
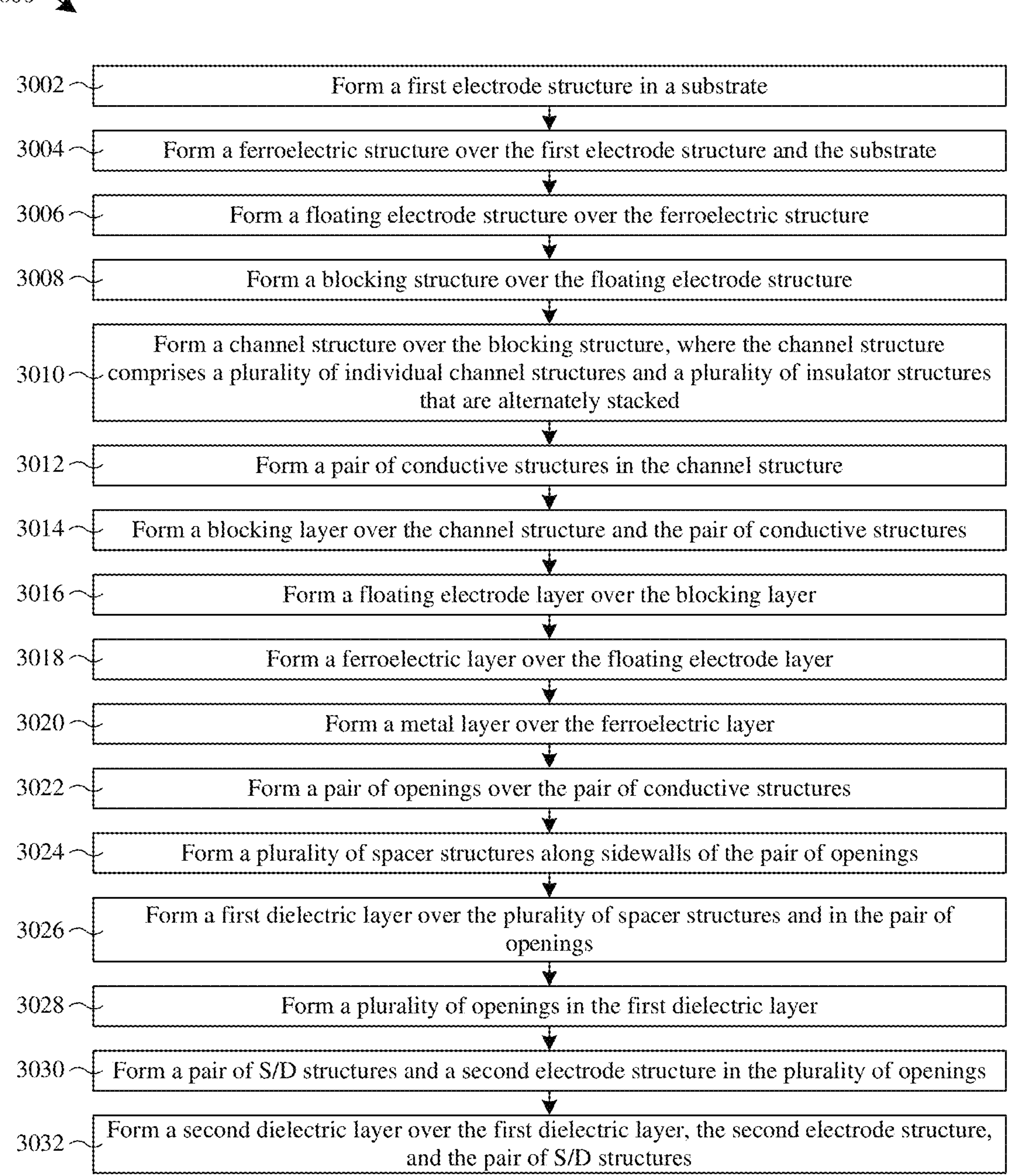
FIG. 30 illustrates a flowchart of some embodiments of a method for forming an integrated chip (IC) comprising a multi-channel ferroelectric memory structure.

FIG. 30 illustrates a flowchart 3000 of some embodiments of a method for forming an integrated chip (IC) comprising a multi-channel ferroelectric memory structure. While the flowchart 3000 of FIG. 30 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 3002, a first electrode structure is formed in a substrate. FIG. 12 illustrates a cross-sectional view 1200 of some embodiments corresponding to act 3002.

At act 3004, a ferroelectric structure is formed over the first electrode structure and the substrate. FIGS. 13-15 illustrate a series of cross-sectional views 1300-1500 of some embodiments corresponding to act 3004.

At act 3006, a floating electrode structure is formed over the ferroelectric structure. FIGS. 16-17 illustrate a series of cross-sectional views 1600-1700 of some embodiments corresponding to act 3006.

At act 3008, a blocking structure is formed over the floating electrode structure. FIG. 18 illustrates a cross-sectional view 1800 of some embodiments corresponding to act 3008.

At act 3010, a channel structure is formed over the blocking structure, where the channel structure comprises a plurality of individual channel structures and a plurality of insulator structures that are alternately stacked. FIG. 19 illustrates a cross-sectional view 1900 of some embodiments corresponding to act 3010.

At act 3012, a pair of conductive structures are formed in the channel structure. FIGS. 20-21 illustrate a series of cross-sectional views 2000-2100 of some embodiments corresponding to act 3012.

At act 3014, a blocking layer is formed over the channel structure and the pair of conductive structures. FIG. 22 illustrates a cross-sectional view 2200 of some embodiments corresponding to act 3014.

At act 3016, a floating electrode layer is formed over the blocking layer. FIG. 22 illustrates a cross-sectional view 2200 of some embodiments corresponding to act 3016.

At act 3018, a ferroelectric layer is formed over the floating electrode layer. FIG. 22 illustrates a cross-sectional view 2200 of some embodiments corresponding to act 3018.

At act 3020, a metal layer is formed over the ferroelectric layer. FIGS. 22-23 illustrate a series of cross-sectional views 2200-2300 of some embodiments corresponding to act 3020.

At act 3022, a pair of openings are formed over the pair of conductive structures. FIG. 24 illustrates a cross-sectional view 2400 of some embodiments corresponding to act 3022.

At act 3024, a plurality of spacer structures are formed along sidewalls of the pair of openings. FIG. 25 illustrates a cross-sectional view 2500 of some embodiments corresponding to act 3024.

At act 3026, a first dielectric layer is formed over the plurality of spacer structures and in the pair of openings. FIG. 26 illustrates a cross-sectional view 2600 of some embodiments corresponding to act 3026.

At act 3028, a plurality of openings are formed in the first dielectric layer. FIG. 27 illustrates a cross-sectional view 2700 of some embodiments corresponding to act 3028.

At act 3030, a pair of S/D structures and a second electrode structure are formed in the plurality of openings. FIG. 28 illustrates a cross-sectional view 2800 of some embodiments corresponding to act 3030.

At act 3032, a second dielectric layer is formed over the first dielectric layer, the second electrode structure, and the pair of S/D structures. FIG. 29 illustrates a cross-sectional view 2900 of some embodiments corresponding to act 3032.

In some embodiments, the present application provides an integrated chip (IC). The IC comprises a first electrode structure disposed in a substrate. A first ferroelectric structure is disposed on a first side of the first electrode structure. A channel structure is disposed on a first side of the first ferroelectric structure, wherein the channel structure comprises a plurality of individual channel structures and a plurality of insulator structures, wherein the plurality of individual channel structures and the plurality of insulator structures are alternately stacked. A pair of source/drain (S/D) structures are disposed on the first side of the first ferroelectric structure, wherein the pair of S/D structures extend vertically through the channel structure, and wherein the first electrode structure is disposed laterally between the S/D structures of the pair of S/D structures.

In some embodiments, the present application provides an integrated chip (IC). The IC comprises a lower electrode disposed in a substrate. a ferroelectric structure is disposed over the lower electrode. A channel structure is disposed over the ferroelectric structure, wherein the channel structure comprises N individual channel structures and N−1 insulator structures, wherein N is an integer that is greater than or equal to 2, and wherein the N individual channel structures and the N−1 insulator structures are vertically stacked in an alternating manner. A dielectric layer is disposed over the channel structure. A pair of source/drain (S/D) structures are disposed over the ferroelectric structure, wherein the pair of S/D structures extend vertically through the dielectric layer and vertically through the channel structure.

In some embodiments, the present application provides a method. The method comprises forming a first ferroelectric structure over a lower electrode structure. A blocking structure is formed over the first ferroelectric structure. A first channel layer is formed over the blocking structure. A first insulator layer is formed over the first channel layer. A second channel layer is formed over the first insulator layer. A dielectric layer is formed over the second channel layer. A first opening is formed that extends vertically through the dielectric layer, the second channel layer, the first insulator layer, and the first channel layer. A second opening is formed that extends vertically through the dielectric layer, the second channel layer, the first insulator layer, and the first channel layer. The second opening is laterally spaced from the first opening. The lower electrode structure is disposed laterally between the first opening and the second opening. A first source/drain (S/D) structure is formed in the first opening. A second S/D structure is formed in the second opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip (IC), comprising:

a first electrode structure disposed in a substrate;

a first ferroelectric structure disposed on a first side of the first electrode structure;

a channel structure disposed on a first side of the first ferroelectric structure, wherein the channel structure comprises a plurality of individual channel structures and a plurality of insulator structures, and wherein the plurality of individual channel structures and the plurality of insulator structures are alternately stacked, wherein an insulator structure of the plurality of insulator structures is a single body of insulating material that extends continuously from a first outer sidewall of an individual channel structure to a second outer sidewall of the individual channel structure; and a pair of source/drain (S/D) structures disposed on the first side of the first ferroelectric structure, wherein the pair of S/D structures extend vertically through the channel structure, and wherein the first electrode structure is disposed laterally between the S/D structures of the pair of S/D structures.

2. The IC of claim 1, wherein:

the first ferroelectric structure is disposed over the first electrode structure;

the channel structure is disposed over the first ferroelectric structure; and the pair of S/D structures are disposed over the first ferroelectric structure.

3. The IC of claim 1, wherein:

the first ferroelectric structure is disposed over both the channel structure and the pair of S/D structures; and the first electrode structure is disposed over the first ferroelectric structure.

4. The IC of claim 1, wherein each individual channel structure of the plurality of individual channel structures is vertically separated from a neighboring individual channel structure by a corresponding one of the plurality of insulator structures.

5. The IC of claim 1, further comprising:

a blocking structure disposed vertically between the channel structure and the first ferroelectric structure and vertically between the channel structure and the pair of S/D structures.

6. The IC of claim 5, further comprising:

a floating electrode structure disposed vertically between the blocking structure and the first ferroelectric structure.

7. The IC of claim 1, further comprising:

a second ferroelectric structure disposed on a first side of the channel structure, wherein the channel structure is disposed vertically between the second ferroelectric structure and the first ferroelectric structure, and wherein the pair of S/D structures extend vertically through the second ferroelectric structure.

8. The IC of claim 7, further comprising:

a second electrode structure disposed on a first side of the second ferroelectric structure, wherein the second ferroelectric structure is disposed vertically between the second electrode structure and the channel structure, and wherein the second electrode structure is disposed laterally between the S/D structures of the pair of S/D structures.

9. The IC of claim 8, further comprising:

a first blocking structure disposed vertically between the channel structure and the first ferroelectric structure and vertically between the channel structure and the pair of S/D structures; and a second blocking structure disposed vertically between the channel structure and the second ferroelectric structure, wherein the pair of S/D structures extend vertically through the second blocking structure.

10. The IC of claim 9, further comprising:

a first floating electrode structure disposed vertically between the first blocking structure and the first ferroelectric structure.

11. The IC of claim 10, further comprising:

a second floating electrode structure disposed vertically between the second blocking structure and the second ferroelectric structure;

a first spacer structure disposed on the first side of the channel structure, wherein the first spacer structure is disposed laterally between the second floating electrode structure and a first S/D structure of the pair of S/D structures, and wherein the first spacer structure is configured to electrically isolate the second floating electrode structure from the first S/D structure; and a second spacer structure disposed on the first side of the channel structure, wherein the second spacer structure is disposed laterally between the second floating electrode structure and a second S/D structure of the pair of S/D structures, wherein the second spacer structure is configured to electrically isolate the second floating electrode structure from the second S/D structure, and wherein the first S/D structure and the second S/D structure are laterally spaced.

12. The IC of claim 11, wherein:

the first spacer structure extends vertically through the second floating electrode structure and the second ferroelectric structure;

the second spacer structure extends vertically through the second floating electrode structure and the second ferroelectric structure;

the first S/D structure extends vertically through the second floating electrode structure and the second ferroelectric structure; and the second S/D structure extends vertically through the second floating electrode structure and the second ferroelectric structure.

13. The IC of claim 12, further comprising:

a metal structure disposed on the first side of the second ferroelectric structure, wherein the metal structure is disposed vertically between the second electrode structure and the second ferroelectric structure, and wherein the first spacer structure, the second spacer structure, the first S/D structure, and the second S/D structure each extend vertically through the metal structure.

14. An integrated chip (IC), comprising:

a lower electrode disposed in a substrate;

a ferroelectric structure disposed over the lower electrode;

a channel structure disposed over the ferroelectric structure, wherein the channel structure comprises N individual channel structures and N−1 insulator structures arranged between an uppermost surface of the channel structure and a lowermost surface of the channel structure, wherein N is an integer that is greater than or equal to 2, and wherein the N individual channel structures and the N−1 insulator structures are vertically stacked in an alternating manner, and wherein the channel structure is free of conductive gate structures between the uppermost surface of the channel structure and the lowermost surface of the channel structure;

a dielectric layer disposed over the channel structure; and a pair of source/drain (S/D) structures disposed over the ferroelectric structure, wherein the pair of S/D structures extend vertically through the dielectric layer and vertically through the channel structure.

15. The IC of claim 14, wherein:

the pair of S/D structures comprises a first S/D structure and a second S/D structure that is laterally spaced from the first S/D structure; and a lower surface of the first S/D structure and a lower surface of the second S/D structure are both disposed nearer the ferroelectric structure than at least 2 of the N individual channel structures.

16. The IC of claim 15, wherein:

the lower surface of the first S/D structure and the lower surface of the second S/D structure are both disposed nearer the ferroelectric structure than at least 1 of the N−1 insulator structures.

17. The IC of claim 16, further comprising:

a blocking structure disposed vertically between the ferroelectric structure and the channel structure, wherein both the lower surface of the first S/D structure and the lower surface of the second S/D structure contact the blocking structure.

18. The IC of claim 14, wherein:

the pair of S/D structures comprises a first S/D structure and a second S/D structure that is laterally spaced from the first S/D structure;

the channel structure has a central portion that extends laterally between the first S/D structure and the second S/D structure;

the channel structure has a first peripheral portion and a second peripheral portion; and the first S/D structure, the second S/D structure, and the central portion of the channel structure are disposed laterally between the first peripheral portion of the channel structure and the second peripheral portion of the channel structure.

19. A method for forming an integrated chip (IC), the method comprising:

forming a first ferroelectric structure over a lower electrode structure;

forming a blocking structure over the first ferroelectric structure;

forming a first channel layer over the blocking structure;

forming a first insulator layer over the first channel layer, the first insulator layer being a single body of insulating material that is continuous from a first outer sidewall of the first channel layer to a second outer sidewall of the first channel layer;

forming a second channel layer over the first insulator layer, the second channel layer being a single body of semiconductor material that is continuous from a first outer sidewall of the first insulator layer to a second outer sidewall of the first insulator layer;

forming a dielectric layer over the second channel layer;

forming a first opening that extends vertically through the dielectric layer, the second channel layer, the first insulator layer, and the first channel layer;

forming a second opening that extends vertically through the dielectric layer, the second channel layer, the first insulator layer, and the first channel layer, wherein the second opening is laterally spaced from the first opening, and wherein the lower electrode structure is disposed laterally between the first opening and the second opening;

forming a first source/drain (S/D) structure in the first opening; and forming a second S/D structure in the second opening.

20. The method of claim 19, wherein:

forming the first opening exposes a first portion of the blocking structure; and forming the second opening exposes a second portion of the blocking structure laterally spaced from the first portion of the blocking structure.

* * * * *